(12) United States Patent
Sasaki

(10) Patent No.: US 11,437,363 B2
(45) Date of Patent: Sep. 6, 2022

(54) DIODE, TRANSISTOR AND DISPLAY DEVICE

(71) Applicant: Japan Display Inc., Minato-ku (JP)

(72) Inventor: Toshinari Sasaki, Minato-ku (JP)

(73) Assignee: JAPAN DISPLAY INC., Tokyo (JP)

( * ) Notice: Subject to any disclaimer, the term of this patent is extended or adjusted under 35 U.S.C. 154(b) by 152 days.

(21) Appl. No.: 16/845,289

(22) Filed: Apr. 10, 2020

(65) Prior Publication Data

US 2020/0243506 A1    Jul. 30, 2020

Related U.S. Application Data

(63) Continuation of application No. PCT/JP2018/033031, filed on Sep. 6, 2018.

(30) Foreign Application Priority Data

Oct. 20, 2017 (JP) .............................. JP2017-203812

(51) Int. Cl.
*H01L 23/62* (2006.01)
*H01L 27/02* (2006.01)
(Continued)

(52) U.S. Cl.
CPC .......... *H01L 27/0255* (2013.01); *G09G 3/20* (2013.01); *H01L 23/482* (2013.01);
(Continued)

(58) Field of Classification Search
CPC ..... H01L 27/02; H01L 27/0255; H01L 27/04; H01L 27/06; H01L 27/088; H01L 21/822;
(Continued)

(56) References Cited

U.S. PATENT DOCUMENTS

| 2011/0216566 A1 | 9/2011 | Kamata |
| 2012/0087460 A1 | 4/2012 | Moriwaki |

(Continued)

FOREIGN PATENT DOCUMENTS

| JP | 2007-220814 | * | 8/2007 |
| JP | 2007-220814 A | | 8/2007 |

(Continued)

OTHER PUBLICATIONS

Interantional Search Report dated Nov. 13, 2018 in PCT/JP2018/033031 filed Sep. 6, 2018, citing documents AA-AB and AO-AQ therein, 2 pages.

(Continued)

*Primary Examiner* — Chuong A Luu
(74) *Attorney, Agent, or Firm* — Maier & Maier, PLLC

(57) ABSTRACT

A diode having a simple structure and a simple manufacturing method of the diode are provided. A diode including: a semiconductor layer having a first region and a second region having a resistance lower than a resistance of the first region; a first insulating layer having a first aperture portion and a second aperture portion and covering the semiconductor layer other than the first aperture and the second aperture, the first aperture portion exposing the semiconductor layer in the first region, the second aperture portion exposing the semiconductor layer in the second region; a first conductive layer connected to the semiconductor layer in the first aperture portion and overlapping with the semiconductor layer in the first region via the first insulating layer in a planar view; and a second conductive layer connected to the semiconductor layer in the second aperture.

16 Claims, 28 Drawing Sheets

(51) Int. Cl.
*G09G 3/20* (2006.01)
*H01L 29/739* (2006.01)
*H01L 29/861* (2006.01)
*H01L 29/66* (2006.01)
*H01L 29/45* (2006.01)
*H01L 29/872* (2006.01)
*H01L 23/482* (2006.01)
*H01L 23/485* (2006.01)
*H01L 29/423* (2006.01)
*H01L 29/06* (2006.01)
*H01L 29/24* (2006.01)

(52) U.S. Cl.
CPC ...... *H01L 23/485* (2013.01); *H01L 29/42376* (2013.01); *H01L 29/45* (2013.01); *H01L 29/66969* (2013.01); *H01L 29/7391* (2013.01); *H01L 29/861* (2013.01); *H01L 29/872* (2013.01); *G09G 2300/0885* (2013.01); *G09G 2330/04* (2013.01); *G09G 2330/08* (2013.01); *H01L 29/0688* (2013.01); *H01L 29/0692* (2013.01); *H01L 29/24* (2013.01)

(58) Field of Classification Search
CPC . H01L 21/8234; H01L 21/482; H01L 21/485; H01L 29/24; H01L 29/78; H01L 29/739; H01L 29/45; H01L 29/66; H01L 29/42376; H01L 29/66969; H01L 29/7391; H01L 29/861; H01L 29/872; H01L 29/0688; H01L 29/0692; H01L 23/62
USPC .......................................................... 257/355
See application file for complete search history.

(56) References Cited

U.S. PATENT DOCUMENTS

| 2013/0057793 | A1 | 3/2013 | Uchida | |
| 2015/0294966 | A1* | 10/2015 | Weyers | H01L 29/861 257/49 |
| 2018/0374875 | A1* | 12/2018 | Tada | H01L 27/124 |

FOREIGN PATENT DOCUMENTS

| JP | WO 2010/147032 A1 | 12/2010 |
| JP | 2017-69577 A | 4/2017 |
| WO | WO 2011/142061 A1 | 11/2011 |

OTHER PUBLICATIONS

Office Action dated Nov. 16, 2021, in Japanese Patent Application No. 2017-203812, English Translation.

* cited by examiner

A                                                        A'

DIODE, TRANSISTOR AND DISPLAY DEVICE

CROSS REFERENCE TO RELATED APPLICATIONS

This application is a U.S. continuation application filed below 35 U.S.C. § 111(a), of International Application No. PCT/JP2018/033031, filed on Sep. 6, 2018, which claims priority to Japanese Patent Application No. 2017-203812 filed on Oct. 20, 2017, the disclosures of which are incorporated by reference.

FIELD

The present invention relates to a diode, a transistor, and a display device having the same.

BACKGROUND

In recent years, semiconductor devices such as transistors and diodes have been used as fine switching elements used in a driving circuit such as a display device or a personal computer. The transistors are used in a pixel circuit for displaying an image, a driving circuit for driving the pixel circuit, and the like. The diodes are used in a protective circuit for protecting a circuit from static electricity or the like, a charge pump circuit for boosting a voltage supplied from a power source, and the like. To efficiently produce a transistor and a diode, for example, as shown in Japanese Laid Open Patent Publication No. 2017-69577, a transistor (diode-connecting transistor) in which a drain terminal and a gate terminal are connected is used as the diode.

The diode-connected transistor is manufactured by connecting a gate terminal and a source terminal of a common transistor or connecting a gate terminal and a drain terminal. That is, number of steps required for manufacturing the diode is the same as number of steps required for manufacturing the transistor.

SUMMARY

A diode according to an embodiment of the present invention including: a semiconductor layer having a first region and a second region having a resistance lower than a resistance of the first region; a first insulating layer having a first aperture portion and a second aperture portion and covering the semiconductor layer other than the first aperture and the second aperture, the first aperture portion exposing the semiconductor layer in the first region, the second aperture portion exposing the semiconductor layer in the second region; a first conductive layer connected to the semiconductor layer in the first aperture portion and overlapping with the semiconductor layer in the first region via the first insulating layer in a planar view; and a second conductive layer connected to the semiconductor layer in the second aperture.

A transistor according to an embodiment of the present invention including: a semiconductor layer having a first region and a second region having a resistance lower than a resistance of the first region; a first insulating layer having a first aperture portion and a second aperture portion and covering the semiconductor layer other than the first aperture and the second aperture, the first aperture portion exposing the semiconductor layer in the first region, the second aperture portion exposing the semiconductor layer in the second region; a first conductive layer connected to the semiconductor layer in the first aperture portion and overlapping with the semiconductor layer in the first region via the first insulating layer in a planar view; a second conductive layer connected to the semiconductor layer in the second aperture; a third conductive layer under the semiconductor layer, the third conductive layer opposing to the semiconductor layer; and a third insulating layer between the semiconductor layer and the third conductive layer.

DESCRIPTION OF EMBODIMENTS

Figure 1:
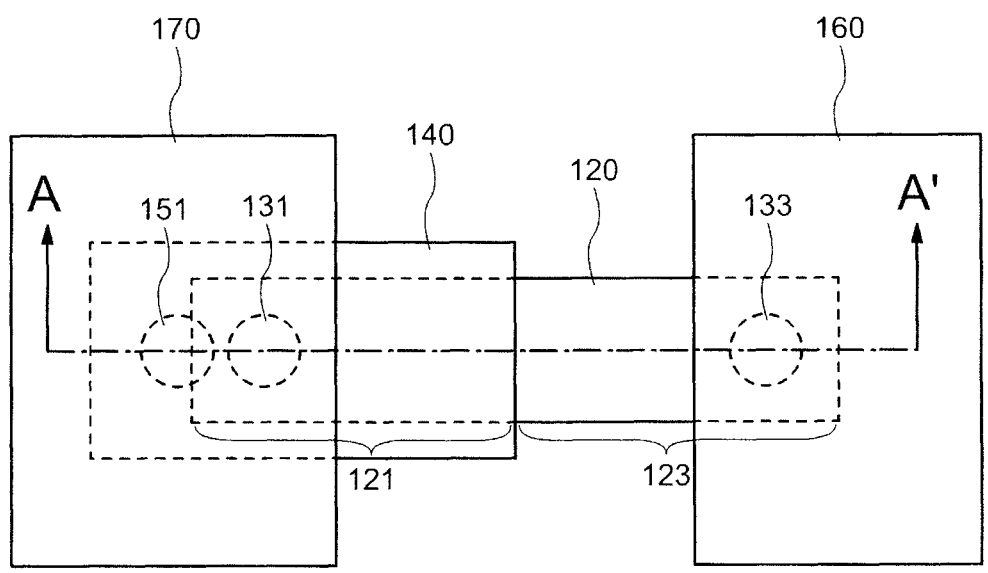
FIG. 1 is a planar view showing an outline of a diode according to an embodiment of the present invention.

Embodiments of the present invention will be described below with reference to the drawings. The disclosure is merely an example. Naturally, a configuration that can be easily conceived by a person skilled in the art by appropriately changing the present invention while maintaining the gist of the invention is included in the scope of the present invention. In the drawings, widths, thicknesses, shapes, and the like of respective portions may be schematically represented as compared with actual embodiments in order to make the description clearer. However, this is merely an example and does not limit the interpretation of the present invention. In this specification and the drawings, the same elements as those described above with reference to the preceding drawings are denoted by the same reference numerals, followed by an alphabet, and a detailed description thereof may be omitted as appropriate.

In the embodiments of the present disclosure, a direction from a substrate to a diode or a direction from the substrate to a transistor is referred to as up or above. Conversely, a direction from the diode to the substrate or from the transistor to the substrate is referred to as down or below. Thus, for convenience of description, the phrase "above" or "below" is used for description. However, for example, a vertical relationship between the substrate and the diode or a vertical relationship between the substrate and the transistor may be reversed. In the following description, for example, an expression "a second member on a first member" merely describes a vertical relationship between the first member and the second member as described above, and the other members may be disposed between the first member and the second member.

In the present specification, the phrases "α includes A, B, or C", "α includes any of A, B, and C", and "α includes one selected from the group consisting of A, B, and C" do not exclude the case where α includes more than one combination of A to C, unless expressly stated otherwise. Furthermore, these expressions do not exclude the case where α includes other elements.

In view of the above circumstances, it is an object of an embodiment of the present disclosure to provide a diode, a transistor and a display device having thereof which have a simple structure and a simple manufacturing method.

First Embodiment

Referring to FIGS. 1 to 7, an outline of a diode 10 according to a first embodiment of the present invention will be described. In the first embodiment, the diode 10 having a structure in which an oxide semiconductor layer is used as an active layer of a diode-connected transistor is exemplified. However, a common semiconductor layer other than the oxide semiconductor layer may be used as the active layer.

[Structure of Diode 10]

Figure 2A:
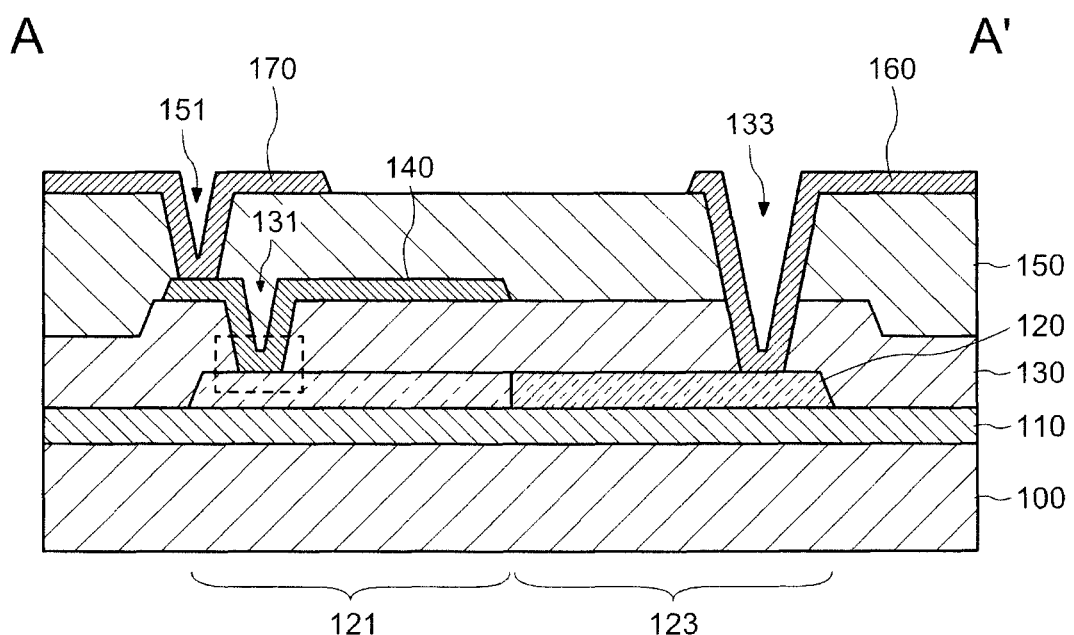
FIG. 2A is a schematic cross-sectional view of a diode according to an embodiment of the present invention.
Figure 2B:
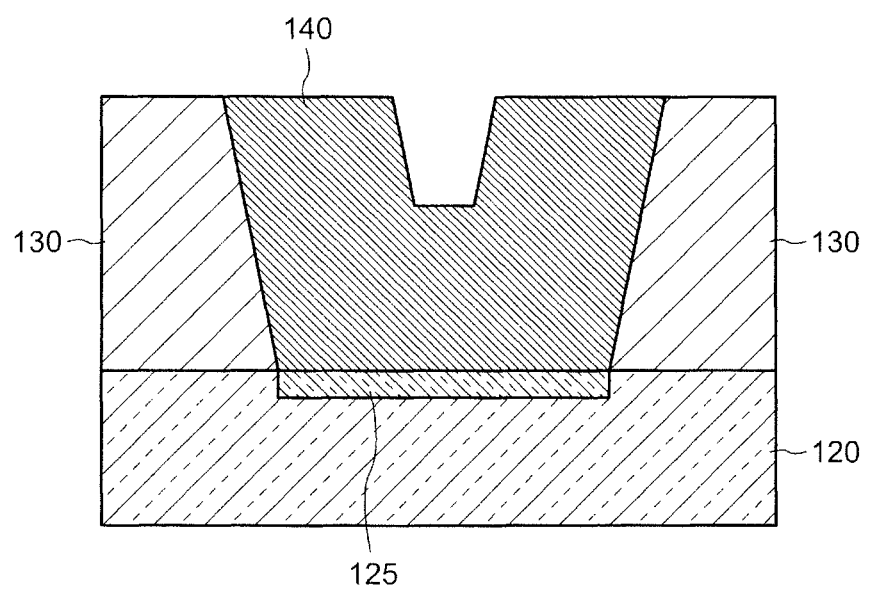
FIG. 2B is a partially enlarged view of a cross-sectional view schematically illustrating the diode according to an embodiment of the present invention.

FIG. 1 is a planar view showing an outline of the diode according to an embodiment of the present invention. FIG. 2A is a schematic cross-sectional view of a diode according to an embodiment of the present invention. FIG. 2B is a partially enlarged view of a cross-sectional view schematically illustrating the diode according to an embodiment of the present invention. The cross-sectional view of FIG. 2A is a cross-sectional view of A-A' line of FIG. 1. The enlarged view of the drawing 2B is an enlarged view of a dotted line region of FIG. 2A. As shown in FIGS. 1 and 2A, the diode 10 includes a substrate 100, an under layer 110, an oxide semiconductor layer 120, an insulating layer 130 (first insulating layer), a conductive layer 140 (first conductive layer), an insulating layer 150 (second insulating layer), a conductive layer 160 (second conductive layer), and a conductive layer 170.

First, the cross-sectional structure of the diode 10 will be described with FIG. 2A. The oxide semiconductor layer 120 is provided on the substrate 100. The under layer 110 is provided between the substrate 100 and the oxide semiconductor layer 120. The oxide semiconductor layer 120 is divided into a first region 121 and a second region 123. The oxide semiconductor layer 120 in the second region 123 has a lower resistivity than the oxide semiconductor layer 120 in the first region 121. The insulating layer 130 is provided on the oxide semiconductor layer 120. The insulating layer 130 is provided with an opening 131 (first exposed portion) and an opening 133 (second exposed portion). The opening 131 exposes the oxide semiconductor layer 120 in the first region 121. The opening 133 exposes the oxide semiconductor layer 120 in the second region 123. The insulating layer 130 covers the oxide semiconductor layer 120 except for the openings 131 and 133.

The conductive layer 140 is provided on the insulating layer 130 and inside of the opening 131. The conductive layer 140 is connected to the oxide semiconductor layer 120 in the first region 121 via the opening 131. Referring to the FIG. 2B, a lower resistance oxide semiconductor layer 125 exists between the oxide semiconductor layer 120 in the first region 121 and the conductive layer 140. A resistance of the lower resistance oxide semiconductor layer 125 is lower than a resistance of the oxide semiconductor layer 120 in the first region 121. The lower resistance oxide semiconductor layer 125 reduces a contact resistance between the conductive layer 140 and the oxide semiconductor layer 120. The lower resistance oxide semiconductor layer 125 is provided in a region where the oxide semiconductor layer 120 is exposed by the opening 131. In other words, in a planar view, the lower resistance oxide semiconductor layer 125 is surrounded by the oxide semiconductor layer 120 having a higher resistivity than the lower resistance oxide semiconductor layer 125.

The lower resistance oxide semiconductor layer 125 is formed near an upper surface of the oxide semiconductor layer 120 and may not be observed by an analysis such as cross-section observation. However, in order to obtain ohmic contact between the oxide semiconductor layer 120 in the first region 121, which has a function as channels, and the conductive layer 140 the lower resistance oxide semiconductor layer 125 is required between them. Therefore, even if the lower resistance oxide semiconductor layer 125 is not observed between the oxide semiconductor layer 120 and the conductive layer 140 in cross-section observation, probability that the lower resistance oxide semiconductor layer 125 exists therebetween is high.

Referring to FIG. 1, the first region 121 corresponds to a region overlapping with the conductive layer 140 in a pattern of the oxide semiconductor layer 120 in a planar view. The second region 123 corresponds to a region where the oxide semiconductor layer 120 is exposed from the conductive layer 140. In other words, the second region 123 corresponds to a region not overlapping with the conductive layer 140 in the pattern of the oxide semiconductor layer 120 in a planar view. In other words, a boundary between the first region 121 and the second region 123 is along a part of the pattern edge of the conductive layer 140 in a planar view.

Referring to FIGS. 1 and 2A, in a planar view, the conductive layer 140 overlaps the oxide semiconductor layer 120 in the first region 121 via the insulating layer 130. In FIGS. 1 and 2A, in a planar view, the boundary between the first region 121 and the second region 123 coincide with a part of the pattern edge of the conductive layer 140, but the embodiment is not limited to this configuration. For example, in a planar view, the boundary between the first region 121 and the second region 123 may not coincide with a part of the pattern edge of the conductive layer 140. For example, in a planar view, the boundary between the first region 121 and the second region 123 may overlaps the conductive layer 140.

The insulating layer 150 is provided on the insulating layer 130 and the conductive layer 140. The insulating layer 150 is provided with an opening 151 and the opening 133. The opening 151 exposes a part of the conductive layer 140. As described above, the opening 133 exposes the oxide semiconductor layer 120 in the second region 123. In the present embodiment, an opening provided in both of the insulating layers 130 and 150 is referred to as the opening 133.

The conductive layer 160 is provided on the insulating layer 150 and inside of the opening 133. In other words, the conductive layer 160 is provided in a layer different from the conductive layer 140. The conductive layer 160 is connected to the oxide semiconductor layer 120 in the second region 123 via the opening 133. Referring to FIG. 1, the oxide semiconductor layer 120 in the second region 123 overlaps the conductive layer 160 in a planar view. The conductive layer 170 is provided on the insulating layer 150 and inside of the opening 151. In other words, the conductive layer 170 is provided in the same layer as the conductive layer 160. The conductive layer 170 is connected to the conductive layer 140 via the opening 151.

The diode 10 is a diode-connected transistor. In the diode 10, the oxide semiconductor layer 120 in the first region 121 corresponds to an active layer. The conductive layer 140 provided on the upper surface of the insulating layer 130 corresponds to an gate electrode. The insulating layer 130 between the oxide semiconductor layer 120 and the conductive layer 140 corresponds to a gate insulating layer. The conductive layer 140 in contact with the oxide semiconductor layer 120 in the opening 131 corresponds to a source electrode. The conductive layer 160 corresponds to a drain electrode. That is, the diode 10 is a transistor in which the source electrode and the gate electrode are connected. In the diode 10, the source electrode and the drain electrode may be switched.

The case when the oxide semiconductor layer 120 is an n-type semiconductor is described. In the case where a potential of the conductive layer 140 is higher than a potential of the conductive layer 160, the transistor is turned on because the gate electrode and the source electrode are supplied with a potential higher than the drain electrode. Therefore, current flows from the conductive layer 140 to the conductive layer 160. On the other hand, in the case where the potential of the conductive layer 140 is lower than the potential of the conductive layer 160, the transistor is turned off because the gate electrode and the source electrode are supplied with a potential lower than the drain electrode. In other words, the diode 10 has a rectification action. A leakage current of the transistor when the transistor in which the oxide semiconductor layer 120 is used as the active layer is in the OFF state is much smaller than a leakage current of a transistor when the transistor in which the common semiconductor layer (e.g., silicon) is used as the active layer is in the OFF state. Therefore, even if a reverse bias is applied to the diode 10, almost no current flows. As a result, an excellent rectification action of the diode 10 is obtained.

[Material of Each Member Constituting the Diode 10]

As the substrate 100, a substrate having a light-transmitting property with respect to visible light is used. As the substrate 100, a rigid substrate without flexibility and a flexible substrate having flexibility is used. A glass substrate, a quartz substrate, and a sapphire substrate may be used as the rigid substrate. A polyimide substrate, an acrylic substrate, a siloxane substrate, and a fluororesin substrate may be used as the flexible substrate. As the substrate 100, a substrate without translucency may be used. A semiconductor substrate such as a silicon substrate, a silicon carbide substrate, a compound semiconductor substrate, or a conductive substrate such as stainless-steel substrate may be used as the substrate 100.

As the under layer 110, a material for improving adhesion between the substrate 100 and the oxide semiconductor layer 120 and a material for suppressing an impurity from reaching the oxide semiconductor layer 120 from the substrate 100 are used. For example, silicon oxide ($SiO_x$), silicon oxynitride ($SiO_xN_y$), silicon nitride oxide ($SiN_xO_y$), silicon nitride ($SiN_x$), aluminum oxide ($AlO_x$), aluminum oxynitride ($AlO_xN_y$), aluminum nitride oxide ($AlN_xO_y$), aluminum nitride ($AlN_x$), or the like is used as the under layer 110 (x, y are any positive values). As the under layer 110, a stacked layer of these materials may be used. The under layer 110 may be omitted if adequate adhesion is ensured between the substrate 100 and the oxide semiconductor layer 120, or if the impurity has little effect on reaching the oxide semiconductor layer 120 from the substrate 100. As the under layer 110, a TEOS layer or an organic insulating material layer may be used other than the above-mentioned inorganic insulating material layer.

$SiO_xN_y$ and $AlO_xN_y$ are silicone compound and aluminum compound that contain less nitrogen (N) than oxygen (O). $SiN_xO_y$ and $AlN_xO_y$ are silicon compound and aluminum compound that contain less oxygen than nitrogen.

The under layer 110 may be formed by Physical Vapor Deposition (PVD) method or Chemical Vapor Deposition (CVD) method. As the PVD method, sputtering method, vacuum evaporation method, electron beam evaporation method, molecular beam epitaxy method, or the like is used. As the CVD method, thermal CVD method, plasma CVD method, catalytic CVD method (Cat(Catalytic)-CVD method or hot-wire CVD method) are used. The TEOS layer refers to a CVD layer made of TEOS (Tetra Ethyl Ortho Silicate).

As the organic insulating material, polyimide resin, acrylic resin, epoxy resin, silicone resin, fluororesin, siloxane resin and the like are used. The under layer 110 may be a single layer or may be a stacked layer of the materials described above. For example, the under layer 110 may be a stacked layer of the inorganic insulating material and the organic insulating material.

As the oxide semiconductor layer 120, metal oxide having semiconductor characteristics is used. For example, an oxide semiconductor containing indium (In), gallium (Ga), zinc (Zn), and oxygen (O) may be used as the oxide semiconductor layer 120. In particular, the oxide semiconductor having a composition ratio of In:Ga:Zn:O=1:1:1:4 may be used as the oxide semiconductor layer 120. However, oxide semiconductor containing In, Ga, Zn, and O used in one embodiment of the invention is not limited to the above-mentioned compositional ratio. As the oxide semiconductor layer 120, an oxide semiconductor having a different compositional ratio from those described above may be used. For example, in order to improve the mobility, an oxide semiconductor having a larger In ratio than the above-mentioned In ratio may be used as the oxide semiconductor layer 120. In order to reduce the effect of the light irradiation, an oxide semiconductor having a Ga ratio larger than the above-mentioned Ga ratio may be used as the oxide semiconductor layer 120 so as to increase the band gap.

Other elements may be added to the oxide semiconductor containing In, Ga, Zn, and O. For example, a metallic element such as Al or Sn may be added to the above-mentioned oxide semiconductor. In addition to the above oxide semiconductor, zinc oxide (ZnO), nickel oxide (NiO), tin oxide ($SnO_2$), titanium oxide ($TiO_2$), vanadium oxide ($VO_2$), indium oxide ($In_2O_3$), strontium titanate ($SrTiO_3$), or the like may be used as the oxide semiconductor layer 120. The oxide semiconductor layer 120 may be amorphous or crystalline. The oxide semiconductor layer 120 may be a mixed phase of amorphous and crystalline. The oxide semiconductor layer 120 is formed by the PVD method.

In the case where common semiconductor layer is used instead of the oxide semiconductor layer 120, silicon (Si), gallium (Ga), gallium arsenide (GaAs), gallium nitride (GaN), or silicon carbide (SiC) may be used as the semiconductor layer.

As the insulating layers 130 and 150, the inorganic insulating material such as $SiO_x$, $SiO_xN_y$, $SiN_x$, $SiN_xO_y$, $AlO_x$, $AlO_xN_y$, $AlN_x$, $AlN_xO_y$ are used. The insulating layers 130 and 150 are formed in the same method as the under layer 110. The insulating layers 130 and 150 may be a single layer or may be a stacked layer of the materials described above. The insulating layers 130 and 150 may be the same material as the under layer 110 or may be a different material from the under layer 110. The insulating layer 130 and the insulating layer 150 may be made of the same material or different materials.

When an oxide is used as the insulating layer 130, the insulating layer 130 in contact with the oxide semiconductor layer 120 preferably contains a large amount of excessive oxygen. In other words, a ratio of oxygen contained in the insulating layer 130 is preferably larger than a ratio of oxygen in stoichiometric ratio of the materials used for the insulating layer 130. In other words, it is preferable that the insulating layer 130 release oxygen by heat treatment. Since oxygen in the insulating layer 130 has a dangling bond, the energy at which the bond of the insulating layer 130 is broken is lower than the bonding energy in the stoichiometric ratio of the materials used for the insulating layer 130. Since the oxygen in the insulating layer 130 has the dangling bond, the oxide semiconductor layer 120 in the second region 123 contains many defects.

Common metallic materials or conductive semiconductor materials are used as the conductive layers 140, 160 and 170. For example, aluminum (Al), titanium (Ti), chromium (Cr), cobalt (Co), nickel (Ni), zinc (Zn), molybdenum (Mo), indium (In), tin (Sn), hafnium (Hf), tantalum (Ta), tungsten (W), platinum (Pt), bismuth (Bi), or the like is used as the conductive layers 140, 160 and 170. Alloys of the above materials may be used as the conductive layers 140, 160 and 170, or nitrides of the above materials may be used. The conductive layers mentioned above are formed by the PVD method.

As the conductive layers 140, 160 and 170, a conductive oxide semiconductor such as indium tin oxide (ITO), indium gallium oxide (IGO), indium zinc oxide (IZO), or zinc oxide doped with gallium (GZO) may be used. The conductive layers 140, 160 and 170 may be a single layer or may be a stacked layer of the materials described above. A material used as the conductive layer 140 and being contact with the oxide semiconductor layer 120 in the first region 121 reduces the oxygen in the oxide semiconductor layer 120 and changes the resistivity of the surface of the oxide semiconductor layer 120 lower. A material in which the oxide of the conductive layer 140 is not insulating characteristic are used as the conductive layer 140.

As described above, according to the diode 10 according to the first embodiment of the present invention, the diode 10 can be configured by the diode-connected transistor having a simpler configuration.

The above-mentioned diode 10 is used for each pixel or a driving circuit of each display device in a Liquid Crystal Display (LCD) Device, a self-luminous display device in which Organic Light-Emitting Diode (OLED) such as organic EL elements or quantum dots is used for a display unit, or a reflective display device such as an electronic paper. However, the above-mentioned diode 10 is not limited to the display device, and may be used for an Integrated Circuit (IC) such as a Micro-Processing Unit (MPU), for example.

[Manufacturing Method of Diode 10]

Referring to FIGS. 3 to 7, a manufacturing method of the diode 10 according to the first embodiment of the present invention will be described with reference to cross-sectional views. FIGS. 3 to 7 are cross-sectional views showing a manufacturing method of the diode according to an embodiment of the present invention.

Figure 3:
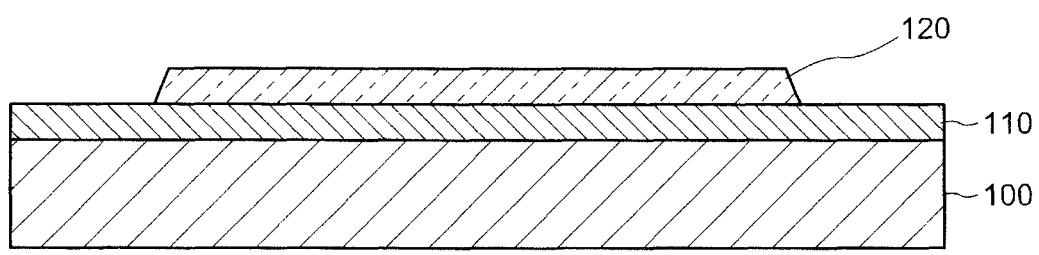
FIG. 3 is a cross-sectional view showing a manufacturing method of a diode according to an embodiment of the present invention.

As shown in FIG. 3, the under layer 110 is formed on the substrate 100, and the oxide semiconductor layer 120 is formed on the under layer 110. The oxide semiconductor layer 120 shown in FIG. 3 is patterned by photolithography process and etching process for the oxide semiconductor layer 120 formed on the entire surface of the substrate 100. Forming the pattern described below is performed by photolithography process and etching process, unless otherwise stated. However, each of the photolithography process and the etching process is adopted a condition suitable for each process.

The oxide semiconductor layer 120 is formed by the sputtering method. The etching for the oxide semiconductor layer 120 may be dry etching or wet etching. When the pattern of the oxide semiconductor layers 120 is formed by wet etching, oxalic acid-containing etchants may be used.

Figure 4:
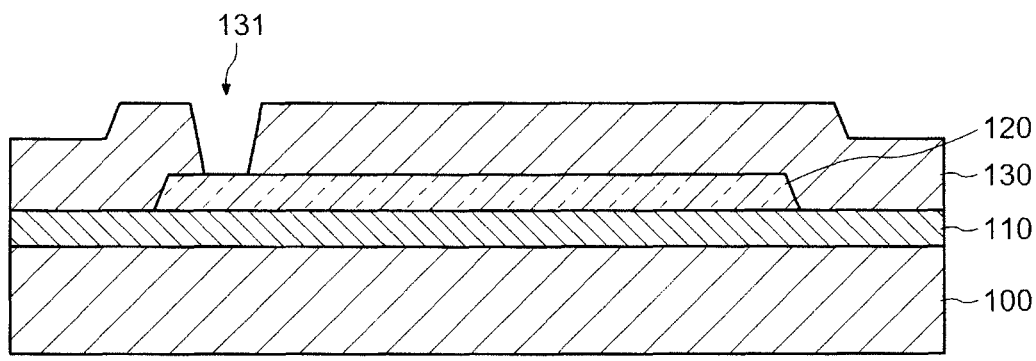
FIG. 4 is a cross-sectional view showing a manufacturing method of a diode according to an embodiment of the present invention.

As shown in FIG. 4, the insulating layer 130 is formed on the oxide semiconductor layer 120. The opening 131 is formed in the insulating layer 130, and a part of the oxide semiconductor layer 120 in the first region 121, which will be described later, is exposed.

Figure 5:
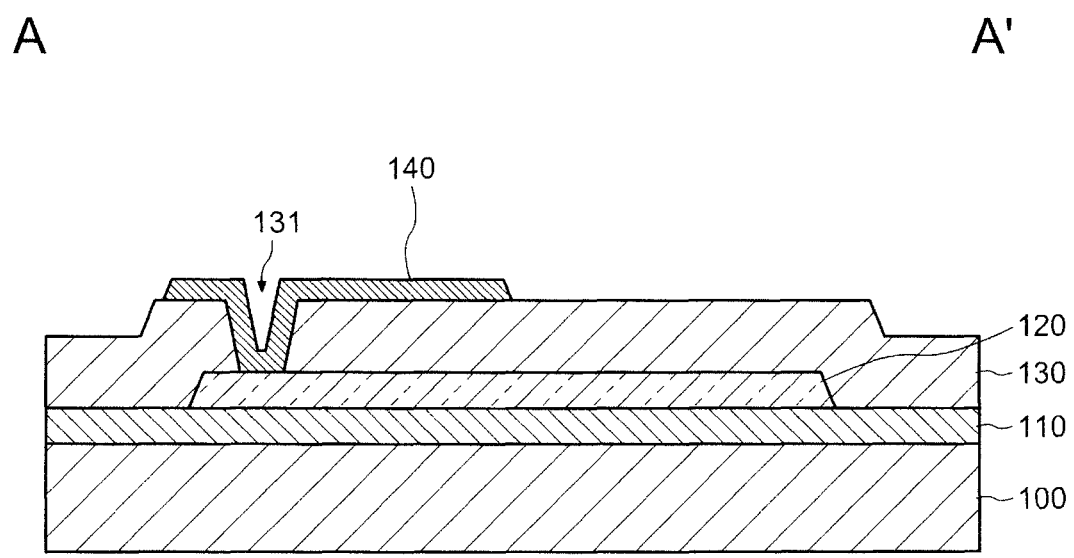
FIG. 5 is a cross-sectional view showing a manufacturing method of a diode according to an embodiment of the present invention.

As shown in FIG. 5, the conductive layer 140 is formed on the insulating layer 130 and inside of the opening 131. When the conductive layer 140 is deposited on the oxide semiconductor layer 120 exposed by the opening 131, the oxygen near a surface of the oxide semiconductor layer 120 is reduced by the conductive layer 140 deposited thereon. As a result, as shown in the FIG. 2B, the lower resistance oxide semiconductor layer 125 is formed in the vicinity of the surface of the oxide semiconductor layer 120 exposed by the opening 131. At this time, the conductive layer 140 formed on a bottom of the opening 131 is oxidized by an oxygen transferred from the oxide semiconductor layer 120. Therefore, it is preferable to use a material that does not lose conductivity even if the material is oxidized as the material of the conductive layer 140. In a planar view, a region where the oxide semiconductor layer 120 and conductive layer 140 overlap is the first region 121, which will be described later.

Figure 6:
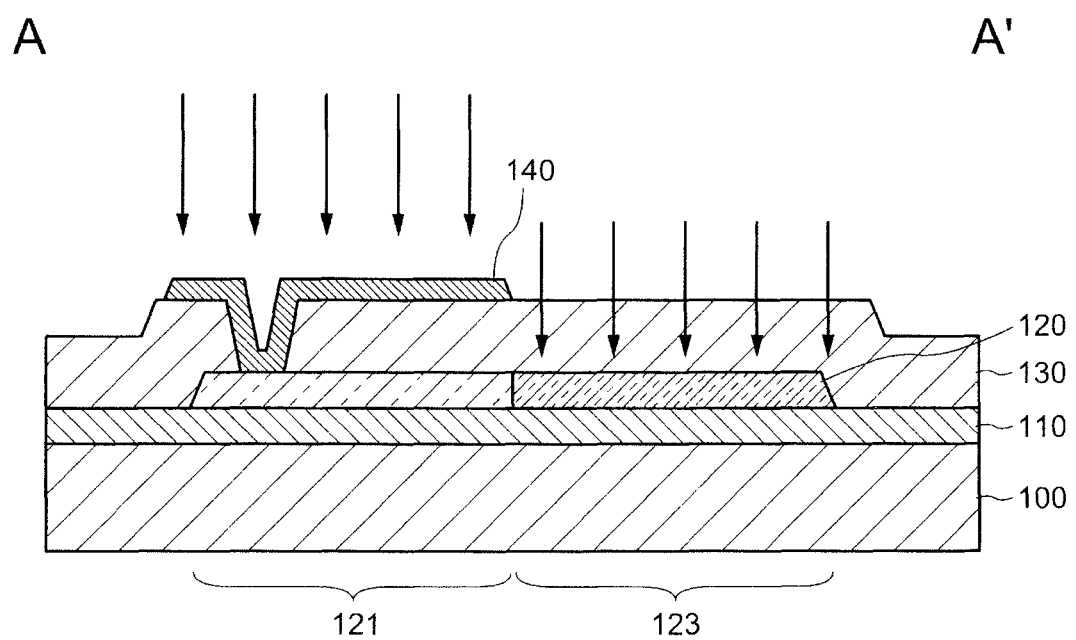
FIG. 6 is a cross-sectional view showing a manufacturing method of a diode according to an embodiment of the present invention.

As shown in FIG. 6, impurities are introduced into the oxide semiconductor layer 120 from above the oxide semiconductor layer 120 (on the side where the conductive layer 140 is formed with respect to the oxide semiconductor layer 120). The impurities are introduced by ion doping or ion implantation. When the impurities are introduced from above, since the impurities are blocked by the conductive layer 140 in a region where the oxide semiconductor layer 120 and the conductive layer 140 overlap in a planar view, the impurities do not reach the oxide semiconductor layer 120. On the other hand, in a region where the oxide semiconductor layer 120 and the conductive layer 140 do not overlap in a planar view, since the impurities are not blocked by the conductive layer 140, the impurities reach the oxide semiconductor layer 120.

The first region 121 is a region where the impurities are not introduced into the oxide semiconductor layer 120. The second region 123 is a region where the impurities are introduced into the oxide semiconductor layer 120. In other words, the first region 121 is a region where the oxide semiconductor layer 120 and conductive layer 140 overlap in a planar view. The second region 123 is a region where the oxide semiconductor layer 120 is exposed from the conductive layer 140 in a planar view. As described above, since the region where the impurities introduced from above are blocked is the first region 121, as a result, the boundary between the first region 121 and the second region 123 in a planar view is along a part of the pattern edge of the conductive layer 140.

FIG. 6 illustrates a configuration in which the boundary between the first region 121 and the second region 123 coincides with a part of the pattern edge of the conductive layer 140. However, when the impurities are introduced, the impurities implanted toward the oxide semiconductor layer 120 are implanted inside the pattern of the conductive layer 140 rather than at the pattern edges of the conductive layer 140. Therefore, in a planar view, the boundary between the first region 121 and the second region 123 may overlap the conductive layer 140.

The impurities introduced into the oxide semiconductor layer 120 function as a carrier. Therefore, a resistance of the oxide semiconductor layer 120 in the second region 123 is lower than a resistance of the oxide semiconductor layer 120 in the first region 121. As the impurities introduced into the oxide semiconductor layer 120, materials used in general semiconductor manufacturing processes, such as boron (B), phosphorus (P), and argon (Ar), are used.

Figure 7:
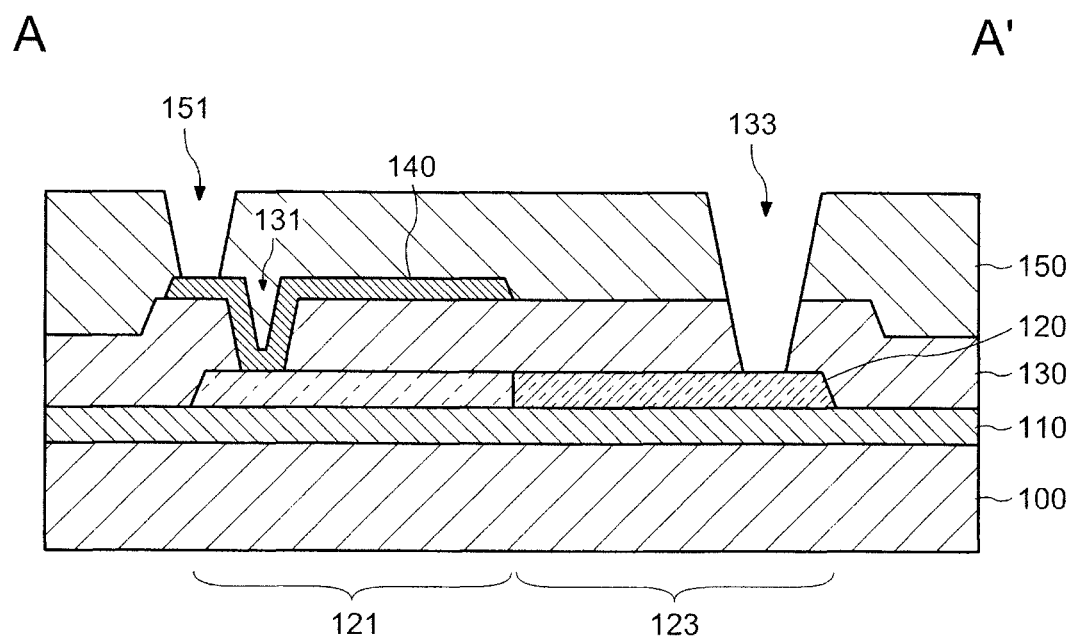
FIG. 7 is a cross-sectional view showing a manufacturing method of a diode according to an embodiment of the present invention.

As shown in FIG. 7, the insulating layer 150 is formed on the insulating layer 130 and the conductive layer 140. The opening 151 is formed in the insulating layer 150 to expose a part of the conductive layer 140. Similarly, the opening 133 is formed in the insulating layers 130 and 150 to expose a part of the oxide semiconductor layer 120 in the second region 123. In the present embodiment, a process that the opening is formed collectively in the insulating layers 130 and 150 is exemplified, but the embodiment is not limited to this process. First, an opening may be formed in the insulating layer 150 to expose a part of the insulating layer 130, and an opening may be formed in the insulating layer 130 in an opening method other than the opening method for the insulating layer 150. Then, the conductive layer is formed on the insulating layer 150, the inside of the opening 133, and the inside of the opening 151, and the conductive layer is patterned to form the conductive layers 160 and 170 shown in FIGS. 1 and 2A. The diode 10 according to the first embodiment is formed by the manufacturing method described above.

As described above, according to the manufacturing method of the diode 10 according to the first embodiment, the impurities are introduced into the oxide semiconductor layer 120 using the conductive layer 140 corresponding to the gate electrode and the source electrode of the diode-connected transistor as a mask. Therefore, the position of the boundary between the first region 121 and the second region 123 can be determined with high accuracy. In addition, there is no need to separately use the mask for forming the first region 121 and the second region 123. When the conductive layer 140 is formed on the oxide semiconductor layer 120 exposed in the opening 131, the conductive layer 140 reduces the resistivity of the surface of the oxide semiconductor layer 120. Therefore, there is no need to provide a low-resistance region in the oxide semiconductor layer 120 in advance in the region where the oxide semiconductor layer 120 contacts the conductive layer 140. That is, the diode 10 can be manufactured by a simpler manufacturing method.

Second Embodiment

An outline of a diode 10A according to the second embodiment of the present invention will be described with reference to FIG. 8. In the drawings referred to in following embodiments, parts that are the same as or have the same functions as those of the above embodiments are denoted by the same numerals or the same numerals followed by the addition of an alphabet, and a repetitive description thereof will be omitted.

[Structure of Diode 10A]

Figure 8:
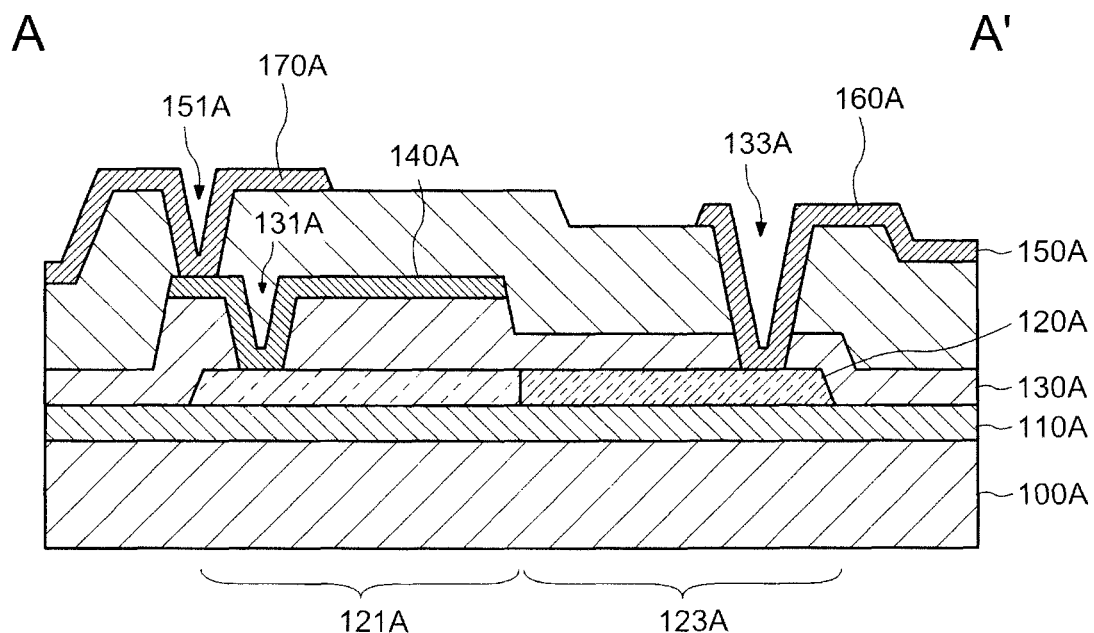
FIG. 8 is a schematic cross-sectional view of a diode according to an embodiment of the present invention.

FIG. 8 is a cross-sectional view showing an outline of the diode according to an embodiment of the present invention. The diode 10A shown in FIG. 8 is similar to the diode 10 shown in FIG. 2A. However, the diode 10A differs from the diode 10 in that a thickness of an insulating layer 130A in a second region 123A is smaller than a thickness of the insulating layer 130A in a first region 121A. In other words, a thickness of the insulating layer 130A exposed from a conductive layer 140A in a planar view is smaller than a thickness of the insulating layer 130A overlapping with the conductive layer 140A. The thickness of the insulating layer 130A in the second region 123A may be 10 nm or more.

[Manufacturing Method of Diode 10A]

The insulating layer 130A of the diode 10A shown in FIG. 8 is obtained by over etching the insulating layer 130 using the conductive layer 140 as a mask in the step of FIG. 5. In the insulating layer 130A of FIG. 8, since the thickness in the second region layer 123A is smaller, impurities are introduced with smaller energy in the step of introducing impurity shown in FIG. 6.

For example, in FIG. 6, when the thickness of the insulating layer 130 in the second region 123 is larger, it is necessary that the impurities are accelerated with high energy in order to introduce the impurities into the insulating layer 130. In this instance, a part of the high-energy accelerated impurities pass through the insulating layer 130 below the conductive layer 140 and the conductive layer 140, and reaches the oxide semiconductor layer 120 in the first region 121. When the impurities are introduced into the oxide semiconductor layer 120 in the first region 121, a leakage current flows when a reverse bias voltage is applied to the diode 10.

As described above, the diode 10A according to the second embodiment of the present invention provides the same effect as the diode 10 according to the first embodiment. Further, in the case of the diode 10A shown in FIG. 8, the impurities can be introduced into an oxide semiconductor layer 120A in the second region 123A with low energies. Therefore, it can be suppressed that unintentional impurities are introduced into the oxide semiconductor layer 120A in the first region 121A.

Third Embodiment

An outline of a diode 10B according to the third embodiment of the present invention will be described with reference to FIG. 9. In the drawings referred to in following embodiments, parts that are the same as or have the same functions as those of the above embodiments are denoted by the same numerals or the same numerals followed by the addition of an alphabet, and a repetitive description thereof will be omitted.

[Structure of Diode 10B]

Figure 9:
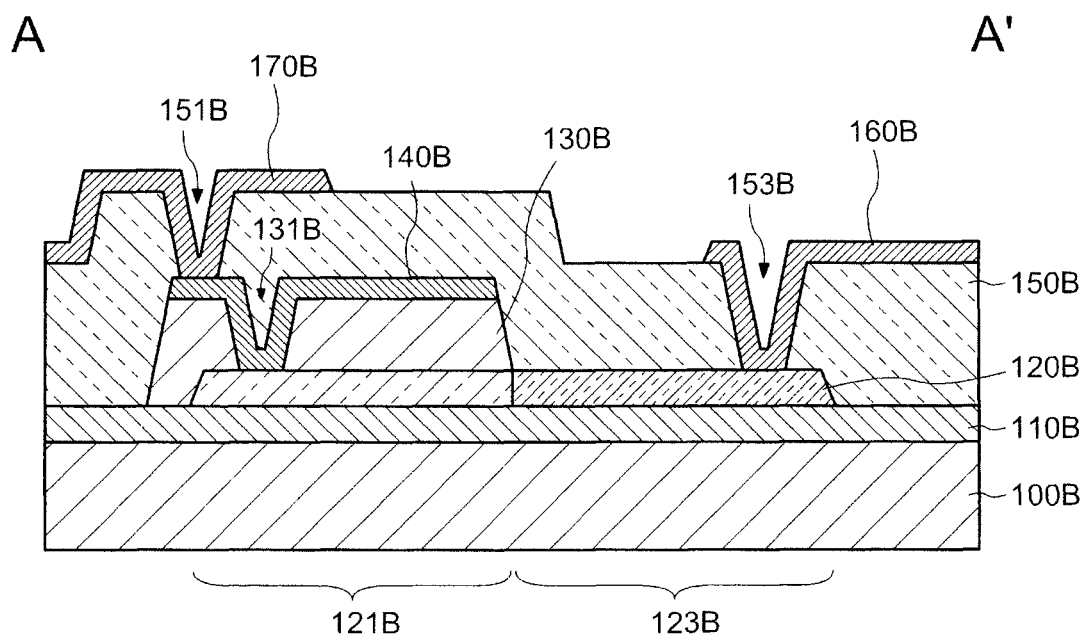
FIG. 9 is a schematic cross-sectional view of a diode according to an embodiment of the present invention.

FIG. 9 is a cross-sectional view showing an outline of the diode according to an embodiment of the present invention. The diode 10B shown in FIG. 9 is similar to the diode 10 shown in FIG. 2A. However, the diode 10B differs from the diode 10 in that an insulating layer 130B in a second region 123B is removed and an insulating layer 150B is in contact with an oxide semiconductor layer 120B in the second region 123B. In other words, the oxide semiconductor layer 120B in the second region 123B is exposed from the insulating layer 130B.

In FIG. 9, a physical property of the insulating layer 150B is different from a physical property of the insulating layer 130B. For example, a ratio of oxygen contained in the oxide insulating layer used for the insulating layer 130B is higher than a ratio of oxygen in stoichiometric ratio of the materials used for the insulating layer 130B. Specifically, a ratio of oxygen contained in $SiO_x$, $SiO_xN_y$ used for the insulating layer 130B is higher than a ratio of oxygen in stoichiometric ratio of the materials mentioned above. On the other hand, the ratio of oxygen contained in the oxide insulating layer used for the insulating layer 150B may be smaller than the ratio of oxygen in stoichiometric ratio of the materials used for the insulating layer 150B. Alternatively, a material from which hydrogen and/or ammonia are/is released by heat treatment can be used for the insulating layer 150B. Specifically, $SiN_x$, $SiN_xO_y$ can be used for the insulating layer 150B. As described above, since the insulating layer 150B hardly releases oxygen and easily releases hydrogen and/or ammonia as compared with the insulating layer 130B, a resistivity of the oxide semiconductor layer 120B in the second region 123B can be lower without providing a step of introducing the impurities into the oxide semiconductor layer 120B in contact with the insulating layer 150B.

[Manufacturing Method of Diode 10B]

Figure 10:
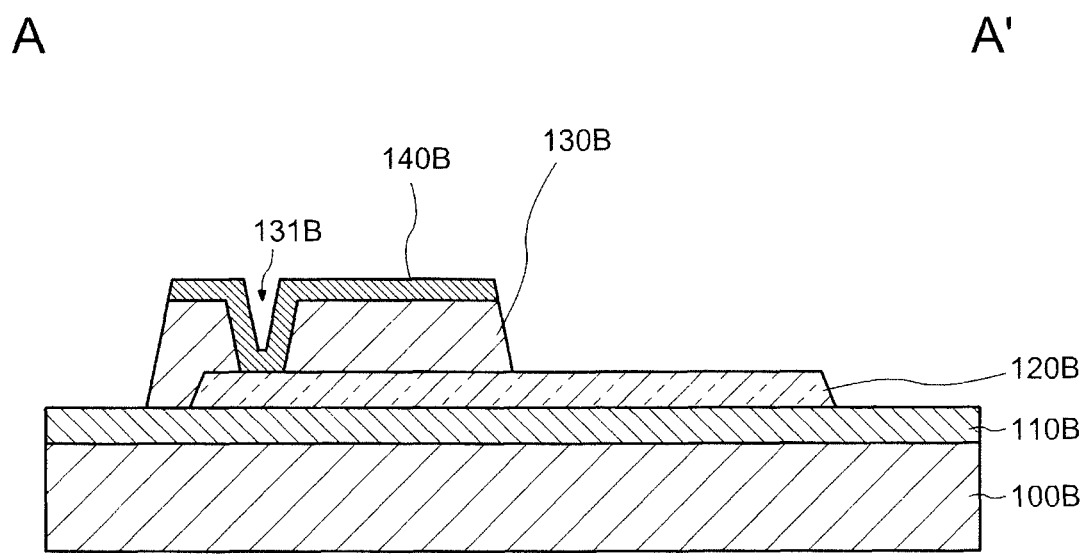
FIG. 10 is a cross-sectional view showing a manufacturing method of a diode according to an embodiment of the present invention.
Figure 11:
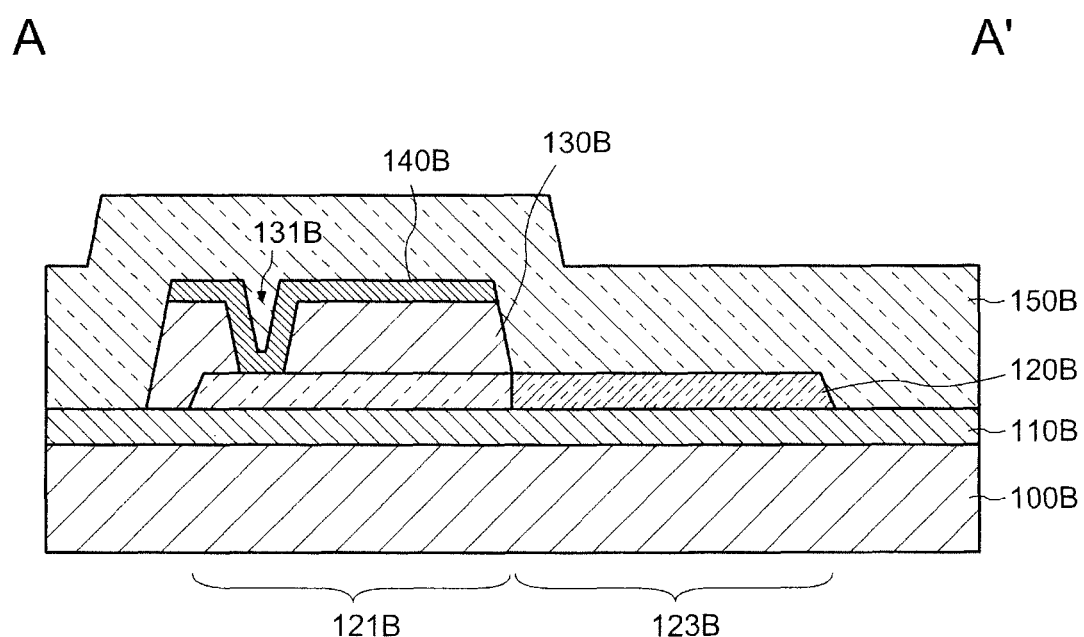
FIG. 11 is a cross-sectional view showing a manufacturing method of a diode according to an embodiment of the present invention.
Figure 12:
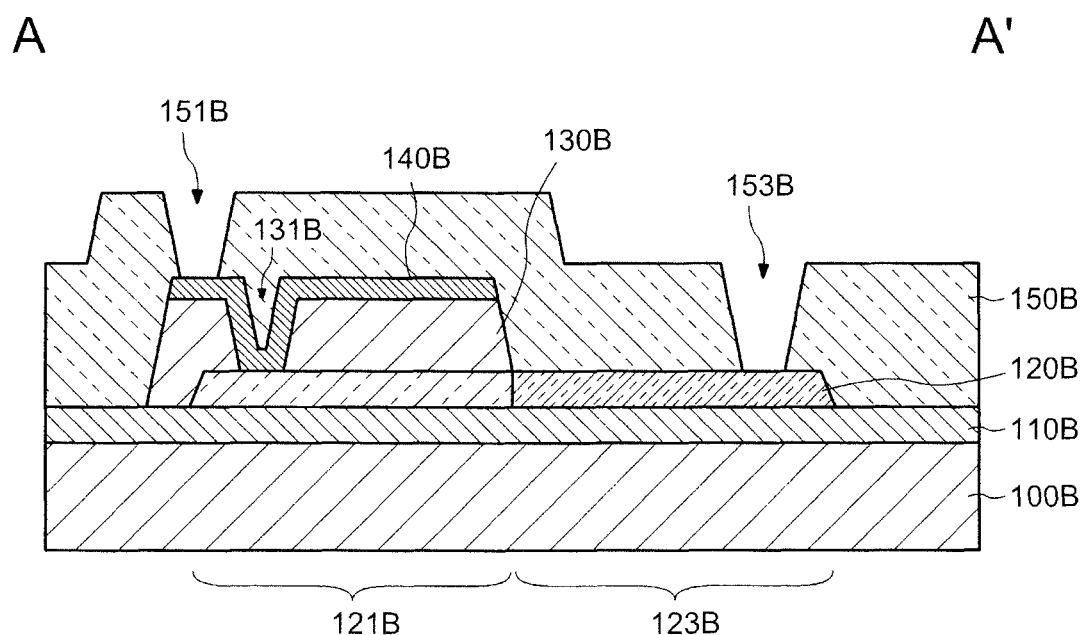
FIG. 12 is a cross-sectional view showing a manufacturing method of a diode according to an embodiment of the present invention.

Referring to FIGS. 10 to 12, a manufacturing method of the diode 10B will be described. FIGS. 10 to 12 are cross-sectional views showing a manufacturing method of the diode according to an embodiment of the present invention. In the manufacturing method of the diode 10B, since the manufacturing method of FIGS. 3 to 5 are the same as the manufacturing method of the diode 10, the description thereof is omitted. As shown in FIG. 10, the insulating layer 130B is etched using a conductive layer 140B as a mask to expose the oxide semiconductor layer 120B. In the present embodiment, the manufacturing method, in which the pattern of the conductive layer 140B is formed after the pattern of the oxide semiconductor layer 120B is formed, is exemplified, but the manufacturing method is not limited to this manufacturing method. For example, the pattern of the oxide semiconductor layer 120B may be formed after the pattern of conductive layer 140B is formed. Since the pattern of the oxide semiconductor layer 120B is formed after the pattern of the conductive layer 140B, the oxide semiconductor layer 120B functions as an etching stopper during the etching in which the oxide semiconductor layer 120B is exposed.

As shown in FIG. 11, on the insulating layer 130B and the conductive layer 140B, the insulating layer 150B is formed on the oxide semiconductor layer 120B exposed from the insulating layer 130B and the conductive layer 140B. As shown in FIG. 10, the oxide semiconductor layer 120B in the second region 123B is exposed from the insulating layer 130B. Therefore, when the insulating layer 150B is formed, the oxide semiconductor layer 120B in the second region 123B is exposed to an atmosphere of forming the insulating layer 150B. By exposing a part of the oxide semiconductor layer 120B to a plasma atmosphere during deposition, oxygen in the vicinity of the surface of the oxide semiconductor layer 120B is reduced, and oxygen deficiency is generated in the oxide semiconductor layer 120B. As a result, the oxide semiconductor layer 120B in the second region 123B is reduced in resistivity.

The insulating layer 150B may be formed under a deposition condition using larger amount of silane. That is, with respect to a ratio of silane to gases other than silane, a ratio of silane used for forming the insulating layer 150B may be higher than a ratio of silane used for forming the other insulating layers (for example, an under layer 110B and the insulating layer 130B). Since the insulating layer 150B is formed under the condition that the silane ratio is higher, the insulating layer 150B having a high hydrogen concentration can be formed by forming the insulating layer 150B. The layer structure of the insulating layer 150B is not particularly limited, but may be, for example, a stacked structure in which a $SiN_x$ is formed on a $SiO_x$.

Heat treatment may be performed after the insulating layer 150B is formed. By the heat treatment, hydrogen contained in the insulating layer 150B diffuses into the oxide semiconductor layer 120B. When the hydrogen reaches the oxide semiconductor layer 120B in the second region 123B, an oxygen deficiency is generated in the oxide semiconductor layer 120B in the second region 123B. As a result, the oxide semiconductor layer 120B in the second region 123B is reduced in resistivity.

As shown in FIG. 12, an opening 151B is formed in the insulating layer 150B, and a part of the conductive layer 140B is exposed. Similarly, an opening 153B is formed in the insulating layer 150B, and a part of the oxide semiconductor layer 120 in the second region 123 is exposed. In the present embodiment, since a thickness of the insulating layer having the opening 151B and a thickness of the insulating layer having the opening 153B are substantially the same, it is easy to control the processing of the openings 151B and 153B. Then, a conductive layer is formed on the insulating layer 150B, inside of the opening 153B, and inside of the opening 151B, and processed to form conductive layers 160B and 170B shown in FIG. 9. The diode 10B according to the first embodiment is formed by the manufacturing method described above.

As described above, the diode 10B according to the third embodiment of the present invention provides the same effect as the diode 10 according to the first embodiment. Further, in the case of the diode 10B shown in FIG. 9, since the insulating layer 150B is formed so as to be in contact with the oxide semiconductor layer 120B in the second region 123B, the resistance of the oxide semiconductor layer 120B in the second region 123B is reduced. That is, since it is not necessary to introduce the impurities, the manufacturing process is shortened.

Fourth Embodiment

Figure 13:
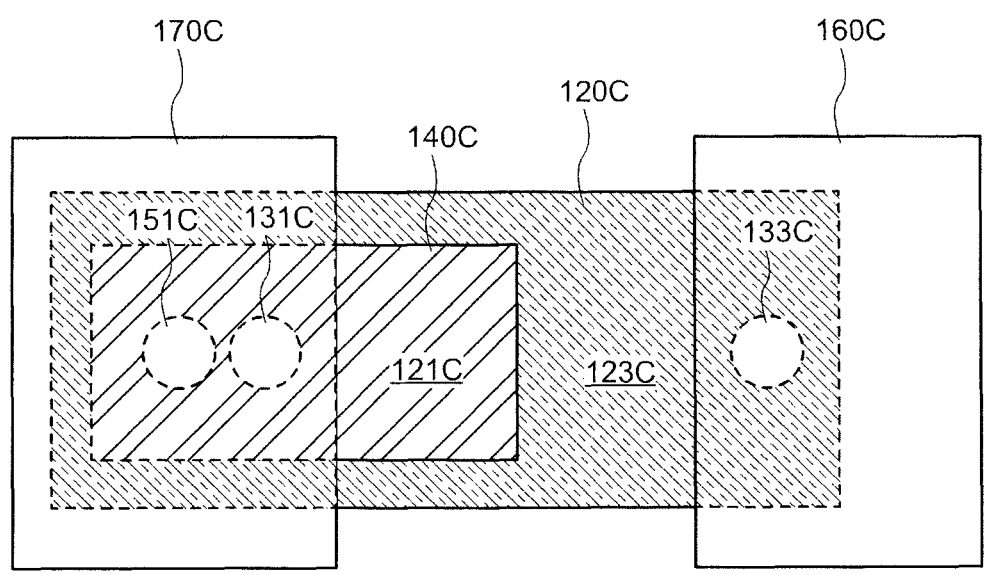
FIG. 13 is a planar view showing an outline of a diode according to an embodiment of the present invention.

Referring to FIG. 13, an outline of a diode 100 according to the fourth embodiment of the present invention will be described. In the drawings referred to in following embodiments, parts that are the same as or have the same functions as those of the above embodiments are denoted by the same numerals or the same numerals followed by the addition of an alphabet, and a repetitive description thereof will be omitted.

[Structure of Diode 100]

FIG. 13 is a planar view showing an outline of the diode according to an embodiment of the present invention. The diode 100 shown in FIG. 13 is similar to the diode 10 shown in FIG. 1. However, in a planar view, the diode 10C differs from the diode 10 in that a pattern end of an oxide semiconductor layer 120C surrounds a pattern end of a conductive layer 140C. In other words, a first region 121C is surrounded by the second region 123C. The oxide semiconductor layer 120C in the first region 121C function as a channel of the diode 100. However, in the configuration of FIG. 13, the pattern end of the oxide semiconductor layer 120C does not function as a channel.

Due to an effect of the patterning process, many oxygen deficiency may be formed in the pattern end of the oxide semiconductor layer 120C. This oxygen deficiency may cause a leakage current when a reverse bias is applied to the diode 10C. Therefore, if the pattern end of the oxide semiconductor layer 120C does not function as a channel, the leakage current due to oxygen deficiency formed in the pattern end of the oxide semiconductor layer 120C can be suppressed.

Fifth Embodiment

Referring to FIGS. 14 to 21, an outline of a transistor 20D according to a fifth embodiment of the invention disclosure will be described. The configuration of the transistor 20D according to the present embodiment is a configuration in which a gate insulating layer and a gate electrode are added to the configuration of the diode 10 according to the first embodiment. In the drawings referred to in following embodiments, parts that are the same as or have the same functions as those of the above embodiments are denoted by the same numerals or the same numerals followed by the addition of an alphabet, and a repetitive description thereof will be omitted.

[Structure of Transistor 20D]

Figure 14:
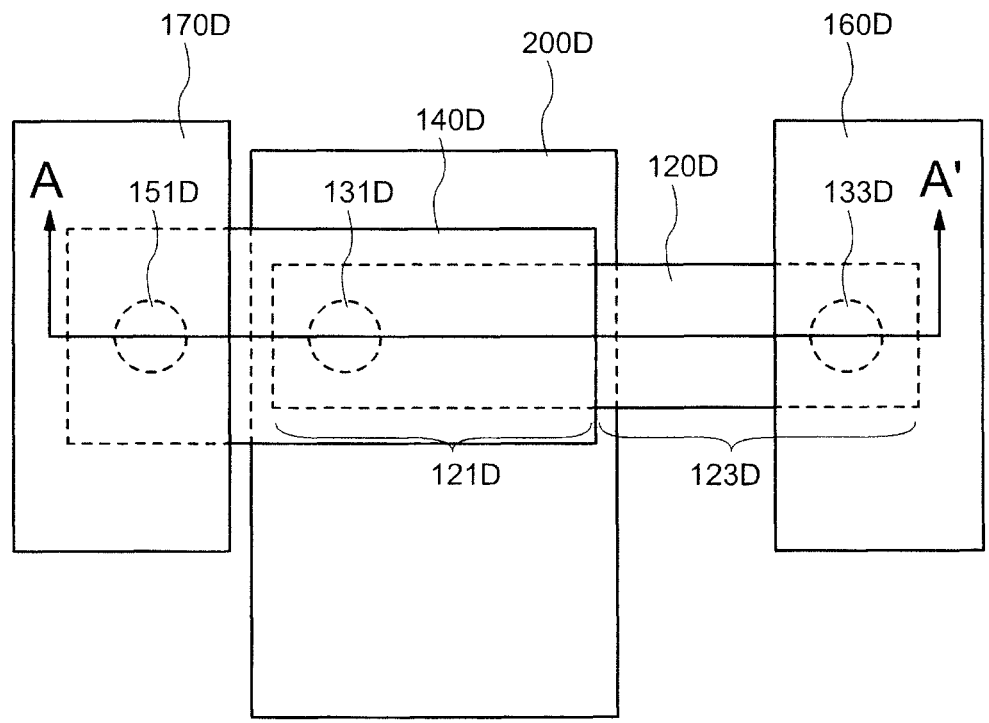
FIG. 14 is a planar view showing an outline of a transistor according to an embodiment of the present invention.
Figure 15:
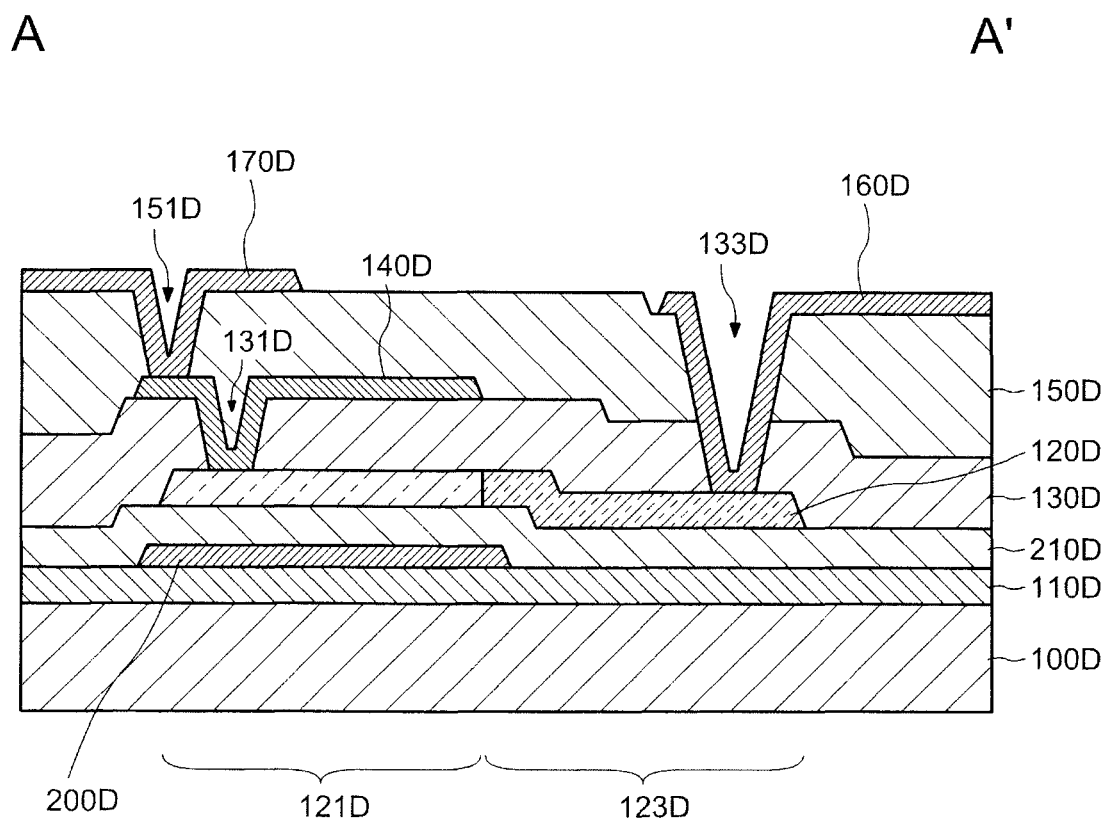
FIG. 15 is a schematic cross-sectional view of a transistor according to an embodiment of the present invention.

FIG. 14 is a planar view showing an outline of a transistor according to an embodiment of the present invention. FIG. 15 is a cross-sectional view showing an outline of the transistor according to an embodiment of the present disclosure. The transistor 20D shown in FIGS. 14 and 15 is similar to the diode 10 shown in FIGS. 1 and 2A. However, the transistor 20D differs from the diode 10 in that a gate electrode 200D (third conductive layer) is provided at a position corresponding to an oxide semiconductor layer 120D in a first region 121D. A gate insulating layer 210D (third insulating layer) is provided between the oxide semiconductor layer 120D and the gate electrode 200D.

As shown in FIG. 14, in a planar view, the gate electrode 200D overlaps with the oxide semiconductor layer 120D in the first region 121D and the oxide semiconductor layer 120D in at least a part of a second region 123D. In other words, a boundary between the first region 121D and the second region 123D exists inside the pattern of the gate electrode 200D than the pattern edge of the gate electrode 200D. The gate electrode 200D is not limited to the above-described configuration, and may be provided at least in a region connecting an opening 131D and the second region 123D in succession. The gate electrode 200D may overlap the oxide semiconductor layer 120D in both regions of the first region 121D and the second region 123D. That is, the pattern edge of the oxide semiconductor layer 120D including the first region 121D and the second region 123D may be surrounded by the pattern edge of the gate electrode 200D.

In the transistor 20D, when a voltage (ON-voltage) for generating carriers in the oxide semiconductor layer 120D in the first region 121D is supplied to the gate electrode 200D, the transistor 20D is in a state in which current flows in both a forward direction from a conductive layer 140D to a conductive layer 160D and a reverse direction from the conductive layer 160D to the conductive layer 140D. When a reverse bias is applied so that the current flow in the reverse direction, carriers generated by the gate electrode 200D are present in the oxide semiconductor layer 120D in the first region 121D. On the other hand, when a forward bias is applied so that the current flow in the forward direction, carriers generated by the conductive layer 140 are present in the oxide semiconductor layer 120D in the first region 121D in addition to the carriers generated by the gate electrode 200D. That is, the current flow in the forward direction is larger than the current flow in the reverse direction. In other words, in the transistor 20D, even when the same voltage is supplied to the gate electrode 200D, the amount of current flows are different depending on the direction of the current flow.

On the other hand, when a voltage (OFF voltage) that does not generate carriers in the oxide semiconductor layer 120D in the first region 121D is supplied to the gate electrode 200D, current flows in the forward direction, but no current flows in the reverse direction. That is, when the gate electrode 200D is supplied with OFF-voltage, the transistor 20D functions as a diode. In other words, the gate electrode 200D switches the function of the transistor 20D to a transistor function or a diode function. The present embodiment exemplifies a configuration in which the gate electrode 200D and the gate insulating layer 210D is provided below the diode 10 of the first embodiment. However, the gate electrode and the gate insulating layer may be provided for the diode of the second to fourth embodiments.

As described above, according to the transistor 20D of the fifth embodiment, the transistor having a higher ON-state current in one direction is provided. In the transistor 20D, the functions of the transistor and the diode are switched by the voltage supplied to the gate electrode 200D.

[Manufacturing Method of Transistor 20D]

Referring to FIGS. 16 to 21, a manufacturing method of the transistor 20D according to the fifth embodiment will be described by referring to cross-sectional views. FIGS. 16 to 21 are cross-sectional views showing manufacturing methods of the transistor according to an embodiment of the present invention.

Figure 16:
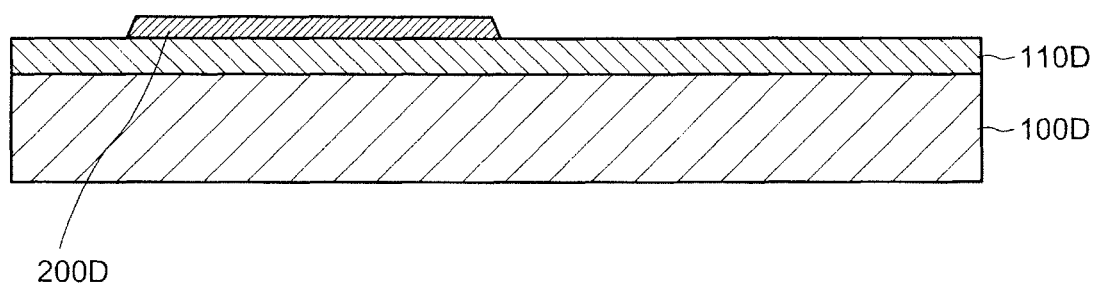
FIG. 16 is a cross-sectional view showing a step of forming a third conductive layer in a process for manufacturing a transistor according to an embodiment of the present invention.

As shown in FIG. 16, an under layer 110D is deposited on a substrate 100D, and a pattern of the gate electrode 200D is formed on the under layer 110D.

Figure 17:
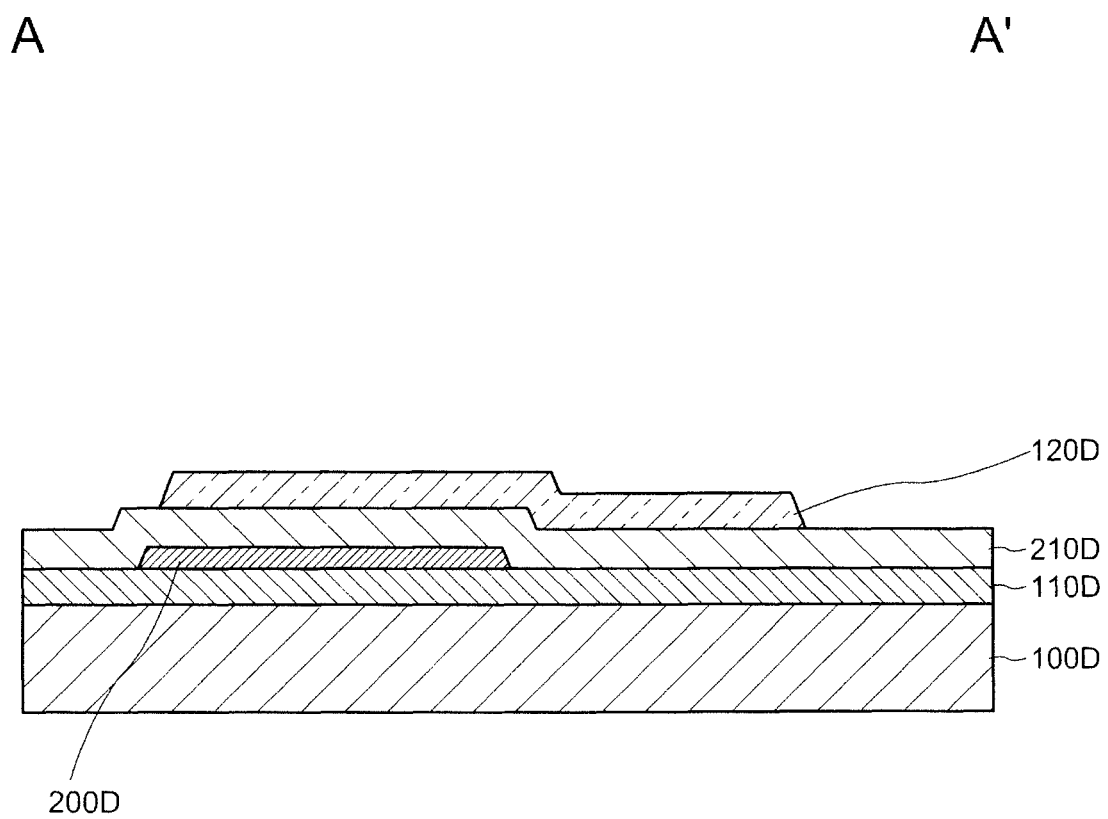
FIG. 17 is a cross-sectional view showing a step of forming a third insulating layer and a oxide semiconductor layer in a process for manufacturing a transistor according to an embodiment of the present invention.

As shown in FIG. 17, the gate insulating layer 210D is formed on the gate electrode 200D and the under layer 110D, and the oxide semiconductor layer 120D is formed on the gate insulating layer 210D.

Figure 18:
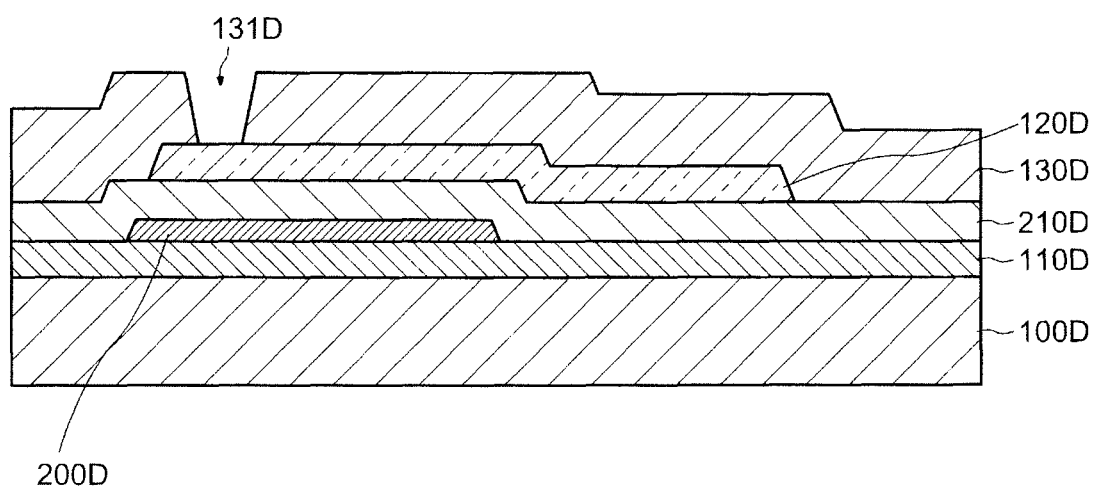
FIG. 18 is a cross-sectional view showing a step of forming a first insulating layer in a process for manufacturing a transistor according to an embodiment of the present invention.

As shown in FIG. 18, an insulating layer 130D is formed on the oxide semiconductor layer 120D. The opening 131D is formed in the insulating layer 130D, and a part of the oxide semiconductor layer 120D in the first region 121D is exposed as described below.

Figure 19:
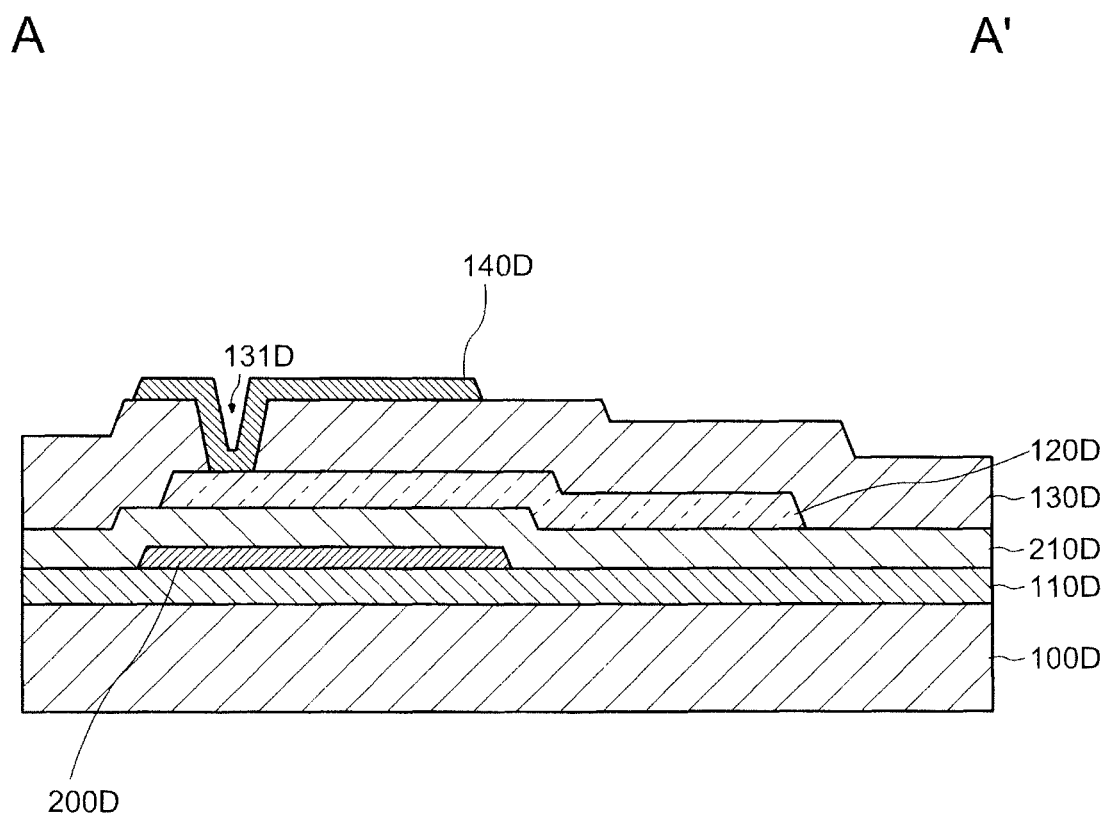
FIG. 19 is a cross-sectional view showing a step of forming a first conductive layer in a process for manufacturing a transistor according to an embodiment of the present invention.

As shown in FIG. 19, the conductive layer 140D is formed on the insulating layer 130D and inside of the opening layer 131D. As described above, when the conductive layer 140D is deposited on the oxide semiconductor layer 120D exposed by the opening 131D, the oxygen near the surface of the oxide semiconductor layer 120D is reduced by the deposited conductive layer 140D. As a result, a lower resistance oxide semiconductor layer having a lower resistivity than that of the oxide semiconductor layer 120D is formed between the oxide semiconductor layer 120D and the conductive layer 140D. As shown in FIG. 19, a pattern end of the conductive layer 140D is located inside the pattern of the gate electrode 200D rather than a pattern end of the gate electrode 200D.

Figure 20:
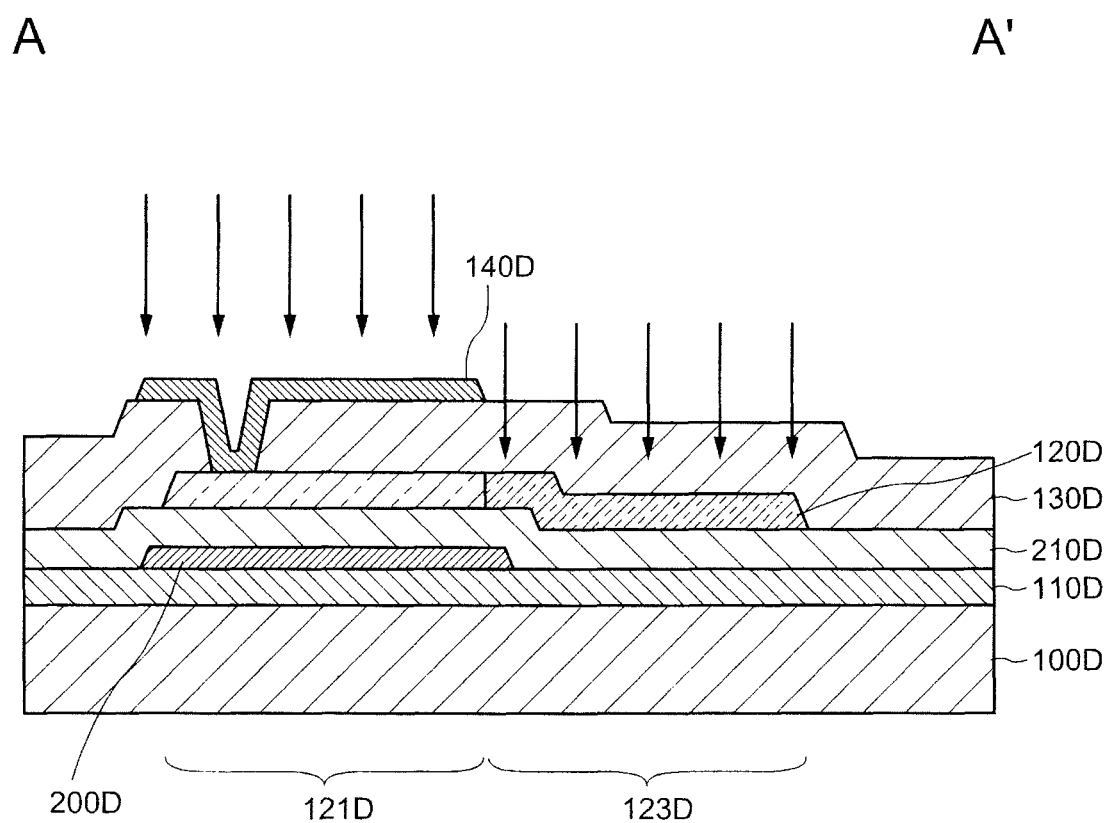
FIG. 20 is a cross-sectional view showing a step of reducing a resistivity of semiconductor layer in a second region in a process for manufacturing a transistor according to the embodiment of the present invention.

As shown in FIG. 20, the impurities are introduced into the oxide semiconductor layer 120D from above the oxide semiconductor layer 120D (on the side where the conductive layer 140D is formed with respect to the oxide semiconductor layer 120D). The impurities are introduced by ion doping or ion implantation. When the impurities are introduced from above, since the impurities are blocked by the conductive layer 140D in a region where the oxide semiconductor layer 120D and the conductive layer 140D overlap in a planar view, the impurities do not reach the oxide semiconductor layer 120D. On the other hand, in a region where the oxide semiconductor layer 120D and the conductive layer 140D do not overlap in a planar view, since the impurities are not blocked by the conductive layer 140D and impurities reach the oxide semiconductor layer 120D.

As described above, the pattern end of the conductive layer 140D is located inside the pattern of the gate electrode 200D rather than the pattern end of the gate electrode 200D. Thus, in a planar view, the oxide semiconductor layer 120D in the first region 121D overlaps the gate electrode 200D. In other words, in transistor 20D, the region where carriers are generated by the voltage supplied to the gate electrode 200D continuously connects the opening 131D and the oxide semiconductor layer 120D in the second region 123D.

Figure 21:
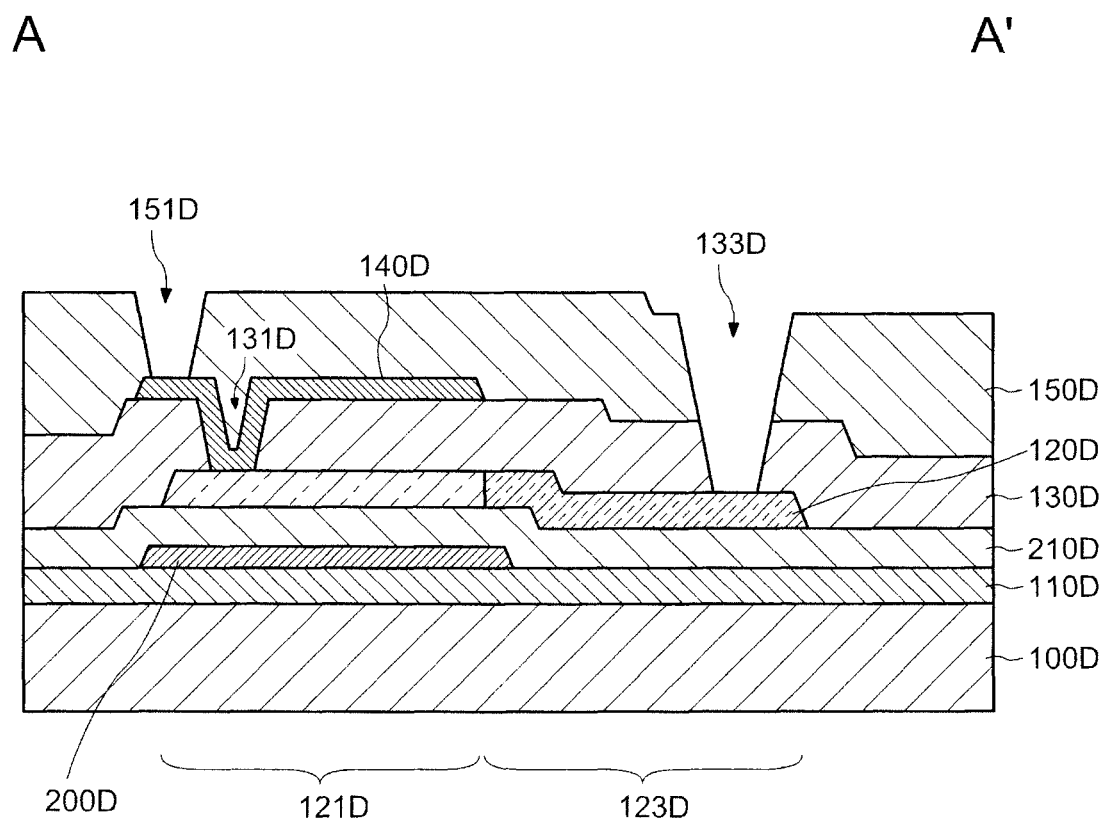
FIG. 21 is a cross-sectional view showing a step of forming an opening to a interlayer insulating layer in a process for manufacturing a transistor according to an embodiment of the present invention.

As shown in FIG. 21, an insulating layer 150D is formed on the insulating layer 130D. An opening 151D is formed in the insulating layer 150D, and a part of the conductive layer 140D is exposed. Similarly, an opening 133D is formed in the insulating layers 130D and 150D, and a part of the oxide semiconductor layer 120D in the second region 123D is exposed. In the present embodiment, a process that the opening is formed collectively in the insulating layers 130D and 150D is exemplified, but the present invention is not limited to this process. First, an opening may be formed in the insulating layer 150D to expose a part of the insulating layer 130D, and an opening may be formed in the insulating layer 130D in an opening method other than opening method for the insulating layer 150D. Then, the conductive layer is formed on the insulating layer 150D, the inside of the opening 133D, and inside of the opening 151D, and the conductive layer is patterned to form the conductive layer 160D and 170D shown in FIGS. 14 and 15. The transistor 20D according to the fifth embodiment is formed by the manufacturing method described above.

As described above, according to the manufacturing method of the transistor 20D according to the fifth embodiment, the transistor 20D is manufactured by a simpler manufacturing method as in the manufacturing method of the diode 10 according to the first embodiment.

Sixth Embodiment

An outline of a transistor 20F according to the sixth embodiment will be described with reference to FIG. 22. In the drawings referred to in the following embodiments, parts that are the same as or have the same functions as those of the above embodiments are denoted by the same numerals or the same numerals followed by the addition of alphabets, and a repetitive description thereof will be omitted.

[Structure of Transistor 20F]

Figure 22:
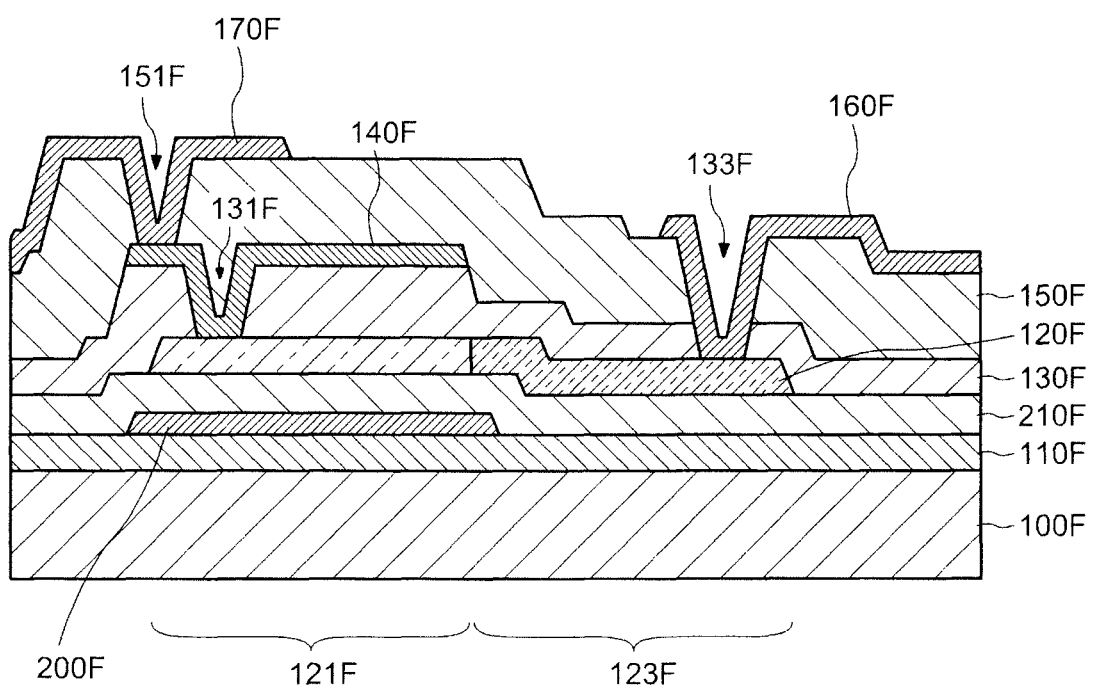
FIG. 22 is a schematic cross-sectional view of a transistor according to an embodiment of the present invention.

FIG. 22 is a cross-sectional view showing an outline of the transistor according to an embodiment of the invention disclosure. A transistor 20F shown in FIG. 22 is similar to the transistor 20D shown in FIG. 15. However, the transistor 20F differs from the transistor 20D in that a thickness of an insulating layer 130F in a second region 123F is smaller than a thickness of the insulating layer 130F in a first region 121F. In other words, the thickness of the insulating layer 130F exposed from a conductive layer 140F in a planar view is smaller than the thickness of the insulating layer 130F overlapping with the conductive layer 140F in a planar view. The thickness of the insulating layer 130F in the second region 123F may be 10 nm or more.

The transistor 20F shown in FIG. 22 is formed in the same method as the diode 10A shown in FIG. 8. The transistor 20F according to the sixth embodiment provides the same effects as the transistor 20D according to the fifth embodiment. Further, in the transistor 20F, like the diode 10A, impurities are introduced into an oxide semiconductor layer 120F in the second region 123F with low energies. Therefore, it can be suppressed that unintentional impurities are introduced into the oxide semiconductor layer 120F in the first region 121F.

Seventh Embodiment

An outline of a transistor 20G according to the seventh embodiment will be described with reference to FIG. 23. In the drawings referred to in following embodiments, parts that are the same as or have the same functions as those of the above embodiments are denoted by the same numerals or the same numerals followed by the addition of an alphabet, and a repetitive description thereof will be omitted.

[Structure of Transistor 20G]

Figure 23:
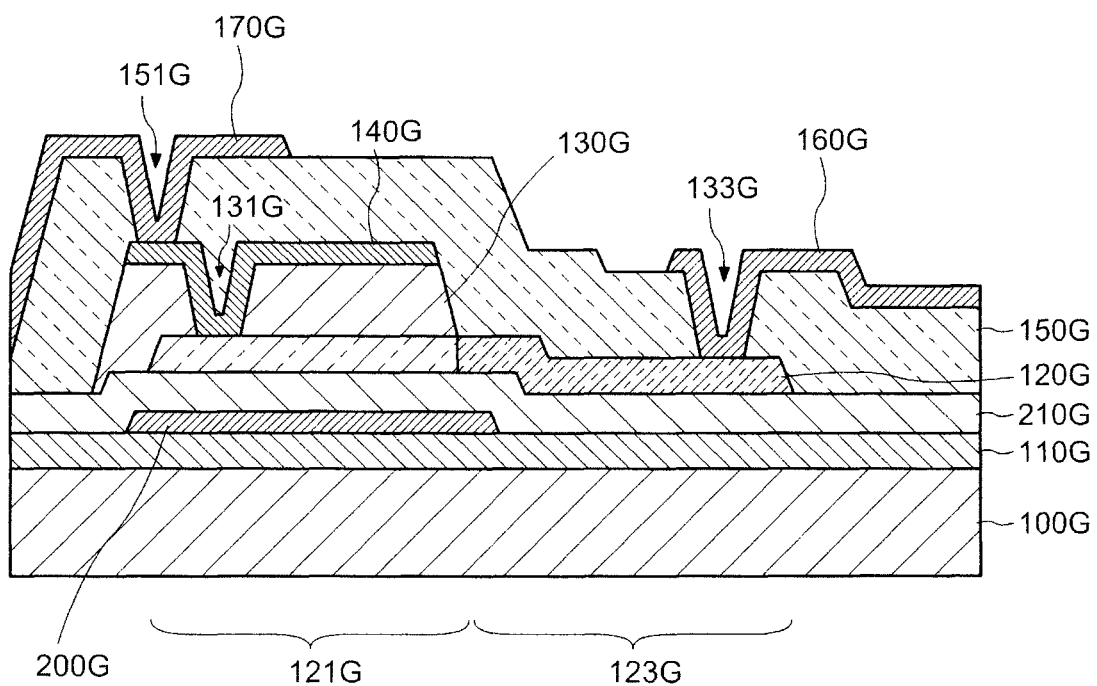
FIG. 23 is a schematic cross-sectional view of a transistor according to an embodiment of the present invention.

FIG. 23 is a cross-sectional view showing an outline of a transistor according to an embodiment of the present invention. The transistor 20G shown in FIG. 23 is similar to the transistor 20D shown in FIG. 15. However, the transistor 20G differs from the transistor 20D in that an insulating layer 130G in a second region 123G is removed and an insulating layer 150G is in contact with an oxide semiconductor layer 120G in the second region 123G. In other words, the oxide semiconductor layer 120G in the second region 123G is exposed from the insulating layer 130G.

In FIG. 23, a physical property of the insulating layer 150G is different from a physical property of the insulating layer 130G. For example, a ratio of oxygen contained in the oxide insulating layer used for the insulating layer 130G is higher than a ratio of oxygen in stoichiometric ratio of the materials used for the insulating layer 130G. Specifically, a ratio of oxygen contained in $SiO_x$, $SiO_xN_y$ used for the insulating layer 130G is higher than a ratio of oxygen in stoichiometric ratio of the materials mentioned above. On the other hand, the ratio of oxygen contained in the oxide insulating layer used for the insulating layer 150G may be smaller than the ratio of oxygen in stoichiometric ratio of the materials used for the insulating layer 150G. Alternatively, a material from which hydrogen and/or ammonia are/is released by heat treatment can be used for the insulating layer 150G. Specifically, $SiN_x$, $SiN_xO_y$ can be used for the insulating layer 150G. As described above, since the insulating layer 150G hardly releases oxygen and easily releases hydrogen and/or ammonia as compared with the insulating layer 130G, a resistivity of the oxide semiconductor layer 120G in the second region 123G can be lower without providing a step of introducing the impurities into the oxide semiconductor layer 120G in contact with the insulating layer 150G.

The transistor 20G shown in FIG. 23 can be formed in the same method as the diode 10B shown in FIG. 9. The transistor 20G according to the seventh embodiment of the present invention provides the same effect as the transistor 20D according to the fifth embodiment. Further, in the case of the transistor 20G, the insulating layer 150G is formed so as to be in contact with the oxide semiconductor layer 120G in the second region 123G, so that the oxide semiconductor layer 120G in the second region 123G has a lower resistance. That is, since it is unnecessary to introduce the impurities, the manufacturing process is shortened.

Eighth Embodiment

An outline of a transistor 20H according to the eighth embodiment will be described with reference to FIG. 24. In the drawings referred to in following embodiments, parts that are the same as or have the same functions as those of the above embodiments are denoted by the same numerals or the same numerals followed by the addition of an alphabet, and a repetitive description thereof will be omitted.

[Structure of Transistor 20H]

Figure 24:
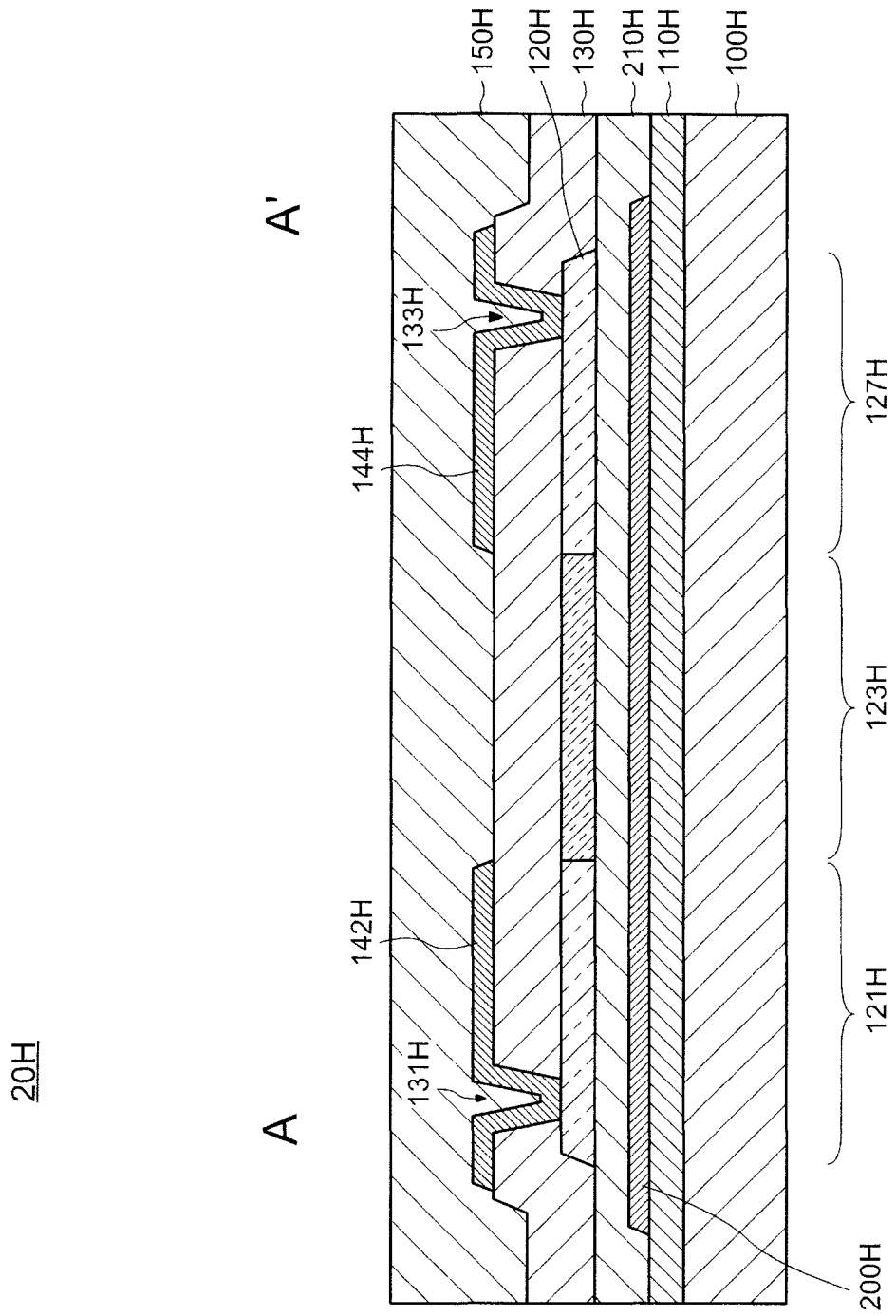
FIG. 24 is a schematic cross-sectional view of a transistor according to an embodiment of the present invention.

FIG. 24 is a cross-sectional view showing an outline of the transistor according to an embodiment of the present invention. The transistor 20H shown in FIG. 24 is a transistor in which the transistor 20D shown in FIG. 15 is connected so as to face each other.

As shown in FIG. 24, an oxide semiconductor layer 120H is divided in the order of a first region 121H, a second region 123H, and a third region 127H. The oxide semiconductor layer 120H in third region 127H has a higher resistivity than the oxide semiconductor layer 120H in the second region 123H, similar to the oxide semiconductor layer 120H in the first region 121H. That is, the resistance of the oxide semiconductor layer 120H in the third region 127H is substantially the same as the resistance of the oxide semiconductor layer 120H in the first region 121H. The second region 123H of the oxide semiconductor layer 120H is provided between the first region layer 121H and the third region layer 127H. A gate electrode 200H is provided corresponding to the oxide semiconductor layer 120H in the first region 121H, the second region 123H, and the third region 127H. The conductive layer 142H is provided corresponding to the first region 121H. That is, in a planar view, the first region 121H is a region overlapped with the conductive layer 142H. The conductive layer 144H is provided corresponding to the third region 127H. That is, in a planar view, the third region 127H is a region overlapped with the conductive layer 144H.

Figure 25:
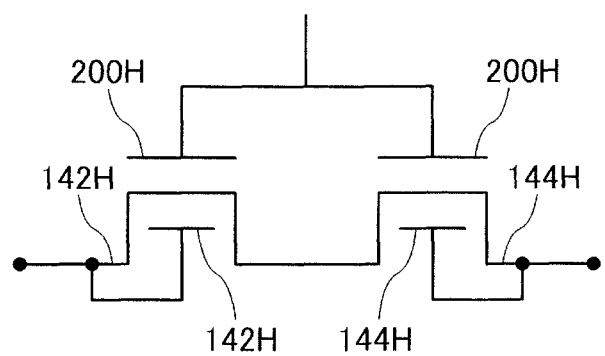
FIG. 25 is a schematic diagram of transistor shown in FIG. 24.
Figure 26:
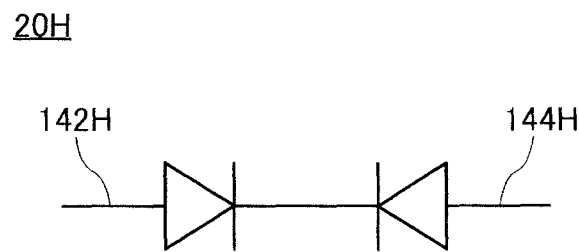
FIG. 26 is a schematic diagram of transistor in a condition of off-state shown in FIG. 24.

FIG. 25 is a schematic diagram of transistor shown in FIG. 24. As shown in FIG. 25, the transistor 20H is a transistor connected in series such that two diode-connected transistors face each other. When the ON voltages are supplied to the gate electrode 200H, the two transistors are turned ON each other and function as a normal transistor that allows current to flow in both directions of the conductive layers 142H and 144H. On the other hand, when the OFF voltages are supplied to the gate electrode 200H, the two transistors are turned OFF, and both of them function as diodes. When the OFF-voltage is supplied to the gate electrode 200H of the transistor 20H, as shown in FIG. 26, the transistor 20H functions as a circuit in which diodes facing away from each other are connected in series. In other words, the transistor 20H can switch between the function of the transistor and the function of the diode according to the voltages supplied to the gate electrode 200H. The circuit shown in FIG. 26 is used, for example, as a protective circuit for protecting the circuit from static electricity or the like.

As described above, according to the transistor 20H according to the eighth embodiment, a transistor capable of switching functions by the voltage supplied to the gate electrode 200H is provided.

The above-mentioned the transistor 20D, 20F, 20G, 20H is used for each pixel or driving circuit of each display device in a reflective type display device such as an LCD, a self-luminous display device using a OLED, or an electronic paper. However, the above transistor is not limited to those used for display device, and may be used for ICs such as MPU, for example.

Ninth Embodiment

An outline of a logical circuit 40J according to the ninth embodiment will be described with reference to FIG. 27. In the drawings referred to in following embodiments, parts that are the same as or have the same functions as those of the above embodiments are denoted by the same numerals or the same numerals followed by the addition of an alphabet, and a repetitive description thereof will be omitted.

Figure 27:
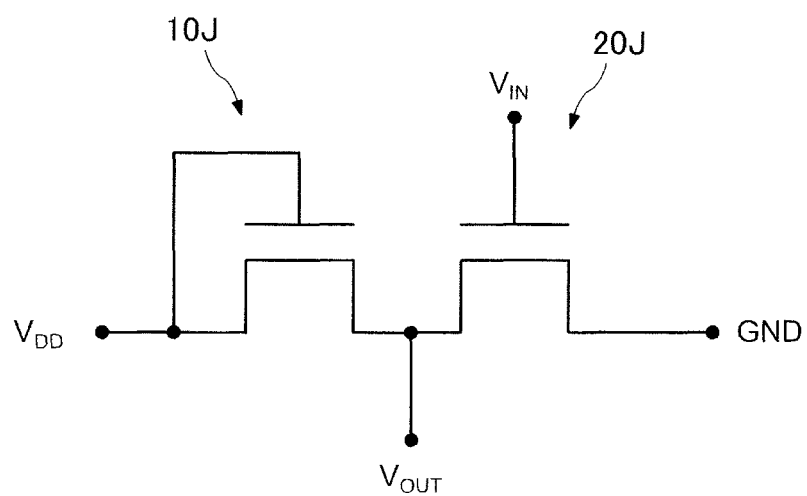
FIG. 27 is a schematic cross-sectional view showing an outline of a logical circuit according to an embodiment of the present invention.

The logical circuit 40J shown in FIG. 27 is an inverter circuit in which a diode 10J and a transistor 20J are used. The source electrode of the diode 10J is connected to the power supply voltage $V_{DD}$. The source electrode of the transistor 20J is connected to the GND. The input-signal $V_{IN}$ is supplied to the gate electrode of the transistor 20J. Output-signal $V_{OUT}$ is output from the drain electrode of the diode 10J and the transistor 20J. As the diode 10J, the diodes of the first to fourth embodiments are used. A common transistor is used as the transistor 20J, but the transistor of the fifth to eighth embodiments may be used.

The logical circuit 40J is used for each pixel or driving circuit of each display device in a reflective type display device such as an LCD, a self-luminous display device using a OLED, or electronic paper. However, the above logical circuit is not limited to those used for display device, and may be used for ICs such as MPUs, for example.

It should be noted that the present invention is not limited to the above-mentioned embodiments, and can be appropriately modified within a range not deviating from the gist.

What is claimed is:

1. A diode comprising:
a semiconductor layer having a first region and a second region having a resistance lower than a resistance of the first region;
a first insulating layer having a first aperture portion and a second aperture portion and covering the semiconductor layer other than the first aperture and the second aperture, the first aperture portion exposing the semiconductor layer in the first region, the second aperture portion exposing the semiconductor layer in the second region;
a first conductive layer connected to the semiconductor layer in the first aperture portion and overlapping with the semiconductor layer in the first region via the first insulating layer in a planar view; and
a second conductive layer connected to the semiconductor layer in the second aperture,
wherein a thickness of the first insulating laver in a region corresponding to the second region is smaller than a thickness of the first insulating layer in a region corresponding to the first region.

2. The diode according to claim 1, wherein a boundary between the first region and the second region is along a part of a pattern end of the first conductive laver in a planar view.

3. The diode according to claim 2, wherein the second conductive layer is provided in a layer different from the first conductive layer.

4. The diode according to claim 3, wherein the semiconductor layer is an oxide semiconductor layer.

5. The diode according to claim 4, further comprising a second insulating layer on the first insulating layer and the first conductive layer,
wherein
the first insulating layer and the second insulating layer have the second opening, and
the second conductive layer is provided on the second insulating layer.

6. The diode according to claim 5, wherein a pattern end of the semiconductor layer surrounds a pattern end of the first conductive layer in a planar view.

7. The diode according to claim 5, wherein the second insulating layer is in contact with the semiconductor layer in the second aperture.

8. A transistor comprising:
a semiconductor layer having a first region and a second region having a resistance lower than a resistance of the first region;
a first insulating layer having a first aperture portion and a second aperture portion and covering the semiconductor layer other than the first aperture and the second aperture, the first aperture portion exposing the semiconductor layer in the first region, the second aperture portion exposing the semiconductor layer in the second region;
a first conductive layer connected to the semiconductor layer in the first aperture portion and overlapping with the semiconductor layer in the first region via the first insulating layer in a planar view;
a second conductive layer connected to the semiconductor layer in the second aperture;
a third conductive layer under the semiconductor layer, the third conductive layer opposing to the semiconductor layer; and
a third insulating layer between the semiconductor layer and the third conductive layer,
wherein a thickness of the first insulating laver in a region corresponding to the second region is smaller than a thickness of the first insulating layer in a region corresponding to the first region.

9. The transistor according to claim 8, wherein a boundary between the first region and the second region is along a part of a pattern end of the first conductive layer in a planar view.

10. The transistor according to claim 9, wherein the second conductive layer is provided in a layer different from the first conductive layer.

11. The transistor according to claim 10, wherein the semiconductor layer is an oxide semiconductor layer.

12. The transistor according to claim 11, further comprising a second insulating layer on the first insulating layer and the first conductive layer,
wherein
the first insulating layer and the second insulating layer have the second opening, and
the second conductive layer is provided on the second insulating layer.

13. The transistor according to claim 12, wherein a pattern end of the semiconductor layer surrounds a pattern end of the first conductive layer in a planar view.

14. The transistor according to claim 12, wherein the third conductive layer overlaps with the semiconductor layer continuously from the first aperture to the second region in a planar view.

15. The transistor according to claim 12, wherein the second insulating layer is in contact with the semiconductor layer in the second aperture.

16. A display device comprising the diode according to claim 1.

* * * * *